US008674747B2

(12) United States Patent
Iwasaki

(10) Patent No.: US 8,674,747 B2
(45) Date of Patent: Mar. 18, 2014

(54) SEMICONDUCTOR DEVICE

(75) Inventor: Tadashi Iwasaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 6 days.

(21) Appl. No.: 13/594,535

(22) Filed: Aug. 24, 2012

(65) Prior Publication Data
US 2013/0049823 A1    Feb. 28, 2013

(30) Foreign Application Priority Data

Aug. 26, 2011    (JP) ................................. 2011-184427

(51) Int. Cl.
*H03K 17/56* (2006.01)
(52) U.S. Cl.
USPC ............................ 327/423; 327/424; 327/108
(58) Field of Classification Search
None
See application file for complete search history.

(56) References Cited

U.S. PATENT DOCUMENTS

| 7,109,759 | B2 | 9/2006 | Tseng |
| 7,176,743 | B2 * | 2/2007 | Leonowich et al. ........... 327/423 |
| 7,336,780 | B2 * | 2/2008 | Lim et al. .................. 379/388.06 |
| 7,408,313 | B1 * | 8/2008 | Kong et al. .................... 318/293 |
| 7,528,629 | B2 * | 5/2009 | Farjadrad et al. ............... 326/86 |
| 7,961,014 | B2 * | 6/2011 | Behel ............................ 327/108 |
| 2004/0246613 | A1 * | 12/2004 | Tseng ............................. 360/1 |
| 2006/0208774 | A1 * | 9/2006 | Leonowich et al. .......... 327/112 |
| 2009/0046784 | A1 | 2/2009 | Tsukamoto et al. |
| 2011/0221481 | A1 * | 9/2011 | Kifuku ......................... 327/109 |

FOREIGN PATENT DOCUMENTS

| JP | 2004-350273 A | 12/2004 |
| JP | 2009-49600 A | 3/2009 |
| JP | 2010-56620 A | 3/2010 |

* cited by examiner

*Primary Examiner* — Tuan T Lam
(74) *Attorney, Agent, or Firm* — Sughrue Mion, PLLC

(57) ABSTRACT

A semiconductor device includes a variable resistor that sets a resistance value as a first resistance value in an emphasis mode, and as a second resistance value smaller than the first resistance value in a de-emphasis mode, a first driver that sets an output impedance as a third resistance value in the emphasis mode, and as a fourth resistance value larger than the third resistance value in the de-emphasis mode, a second driver that sets the output impedance as a fifth resistance value in the emphasis mode, and as a sixth resistance value larger than the fifth resistance value in the de-emphasis mode, and a controller that controls conductive states of the first and second drivers according to an input signal, and switches the output impedances of the first and second drivers and the resistance value of the variable resistor between the emphasis mode and the de-emphasis mode.

12 Claims, 12 Drawing Sheets

SEMICONDUCTOR DEVICE

CROSS-REFERENCE TO RELATED APPLICATIONS

The disclosure of Japanese Patent Application No. 2011-184427 filed on Aug. 26, 2011 including the specification, drawings and abstract is incorporated herein by reference in its entirety.

BACKGROUND

The present invention relates to a semiconductor device, and more particularly to a semiconductor device that outputs a differential signal with the aid of an H-bridge circuit.

In a high-speed interface, there has been used a CML (current mode logic) signal that conducts a high-speed signal transmission by preventing an output transistor from being saturated by limiting an output current. However, there arises such a problem that because a signal level is set according to a current, a driver circuit that deals with the CML signal increases power consumption. Under the circumstances, in recent years, a VML (voltage mode logic) signal is frequently used instead of the CML signal. Because the VML signal is transmitted according to a voltage level, there is advantageous in that the power consumption of the driver circuit can be reduced more than the driver circuit that deals with the CML signal.

In the driver circuit that deals with the VML signal, an H-bridge circuit is used in order to balance the differential signal. Also, because the VML signal is attenuated in a transmission line, the VML signal is subjected to emphasis processing in order to compensate the attenuation of the VML signal.

Examples of the driver circuit that thus generates the VML signal with the aid of the H-bridge circuit are disclosed in Japanese Patent Unexamined Application Publication Nos. 2004-350273, 2009-49600, and 2010-56620. Each of Japanese Patent Unexamined Application Publication Nos. 2004-350273, 2009-49600, and 2010-56620 discloses the H-bridge circuit in which an internal resistor is coupled between first and second output terminals. Also, in each of Japanese Patent Unexamined Application Publication Nos. 2004-350273, 2009-49600, and 2010-56620, the differential signal is output with the aid of an emphasis mode for increasing an amplitude of the differential signal to be output, and a de-emphasis mode for decreasing the amplitude of the differential signal. In Japanese Patent Unexamined Application Publication No. 2004-350273, an output impedance of a driver that sets an output current is variable between the emphasis mode and the de-emphasis mode to make the amplitude of the differential signal variable. Also, in Japanese Patent Unexamined Application Publication Nos. 2009-49600 and 2010-56620, an internal resistance coupled between the first and second output terminals is enabled in the emphasis mode, and the internal resistance is disabled in the non-emphasis mode to make the amplitude of the differential signal variable.

SUMMARY

However, in Japanese Patent Unexamined Application Publication Nos. 2004-350273, 2009-49600, and 2010-56620, a total of an impedance of the driver configuring the H-bridge circuit, and a combined resistance of the internal resistance and a load resistance is different between the emphasis mode and the de-emphasis mode. That is, in Japanese Patent Unexamined Application Publication Nos. 2004-350273, 2009-49600, and 2010-56620, a current that flows from a supply terminal to a ground terminal through the driver circuit is variable between the emphasis mode and the de-emphasis mode.

For that reason, when the driver circuit disclosed in Japanese Patent Unexamined Application Publication Nos. 2004-350273, 2009-49600, and 2010-56620 is used, the mode is switched between the emphasis mode and the de-emphasis mode to increase or decrease a current consumption in the driver circuit. A variation in the current consumption causes a variation in a supply voltage. In the driver circuit that deals with the VML signal, a voltage level of an output signal is set according to voltages resulting from dividing the supply voltage by three resistance values including a resistance value between the supply terminal and a first output terminal, a resistance value between the first output terminal and a second output terminal, and a resistance value between the second output terminal and the ground terminal. For that reason, in the driver circuit that deals with the VML signal, there arises such a problem that the signal level is varied according to the variation in the supply voltage to deteriorate a jitter characteristic of the output signal.

According to one aspect of the present invention, there is provided a semiconductor device including: first and second output terminals that are coupled with a load resistor, and output a differential signal; a variable resistor that is disposed between the first output terminal and the second output terminal, and has a resistance value thereof as a first resistance value in an emphasis mode, and as a second resistance value smaller than the first resistance value in a de-emphasis mode; a first driver that is disposed between a first supply terminal and the first output terminal, and has an output impedance thereof as a third resistance value in the emphasis mode, and as a fourth resistance value larger than the third resistance value in the de-emphasis mode; a second driver that is disposed between a second supply terminal and the second output terminal, and has an output impedance thereof as a fifth resistance value in the emphasis mode, and as a sixth resistance value larger than the fifth resistance value in the de-emphasis mode; and a controller that controls conductive states of the first and second drivers according to an input signal, and switches the output impedances of the first and second drivers and the resistance value of the variable resistor between the emphasis mode and the de-emphasis mode, wherein the first and second resistance values are set to values so that a ratio between a first differential resistance value that is a combined resistance of the first resistance value and the load resistance, and a second differential resistance value that is a combined resistance of the second resistance value and the load resistance, corresponds to a ratio between an amplitude of the differential signal in the emphasis mode and an amplitude of the differential signal in the de-emphasis mode, and wherein a difference between a first output resistance value indicative of a combined resistance of the third resistance value and the fifth resistance value, and a second output resistance value indicative of a combined resistance of the fourth resistance value and the sixth resistance value is set to a value corresponding to a difference between the first differential resistance value and the second differential resistance value.

According to another aspect of the present invention, there is provided a semiconductor device including: first and second output terminals that are coupled with a load resistor; a variable resistor that is disposed between the first output terminal and the second output terminal; a first driver that is disposed between a first supply terminal and the first output terminal; a second driver that is disposed between a second supply terminal and the second output terminal, and controlled in a conductive state together with the first driver; a third driver that is disposed between the first supply terminal and the second output terminal, and controlled in the conductive state complementary with the first driver; a fourth driver that is disposed between the second supply terminal and the first output terminal, and controlled in the conductive state together with the third driver; and a controller that controls the variable resistor and the first to fourth drivers in any one mode of an emphasis mode that increases an amplitude of a differential signal output from the first and second output terminal, and a de-emphasis mode that decreases the amplitude of the differential signal, wherein the first to fourth drivers allow a substantially constant current to flow in any mode while increasing the output impedance according to switching from the emphasis mode to the de-emphasis mode, and wherein the variable resistor varies a resistance value thereof so that a current flowing in the load resistor decreases according to the switching from the emphasis mode to the de-emphasis mode.

According to the semiconductor device of the present invention, in the emphasis mode and de-emphasis mode, the resistance value of the combined resistance of the plurality of resistors configuring the driver, which is in the conductive state among the first to fourth drivers, and the variable resistors, and the load resistance is kept constant. As a result, in the semiconductor device according to the present invention, a current flowing from the first supply terminal to the second supply terminal is kept constant in the emphasis mode and de-emphasis mode, thereby making it possible to suppress a variation in the supply voltage.

In the semiconductor device according to the present invention, the variation in the supply voltage associated with the switching between the emphasis mode and the de-emphasis mode is suppressed, thereby making it possible to improve the jitter characteristic of the output signal.

DETAILED DESCRIPTION

First Embodiment

Figure 1:
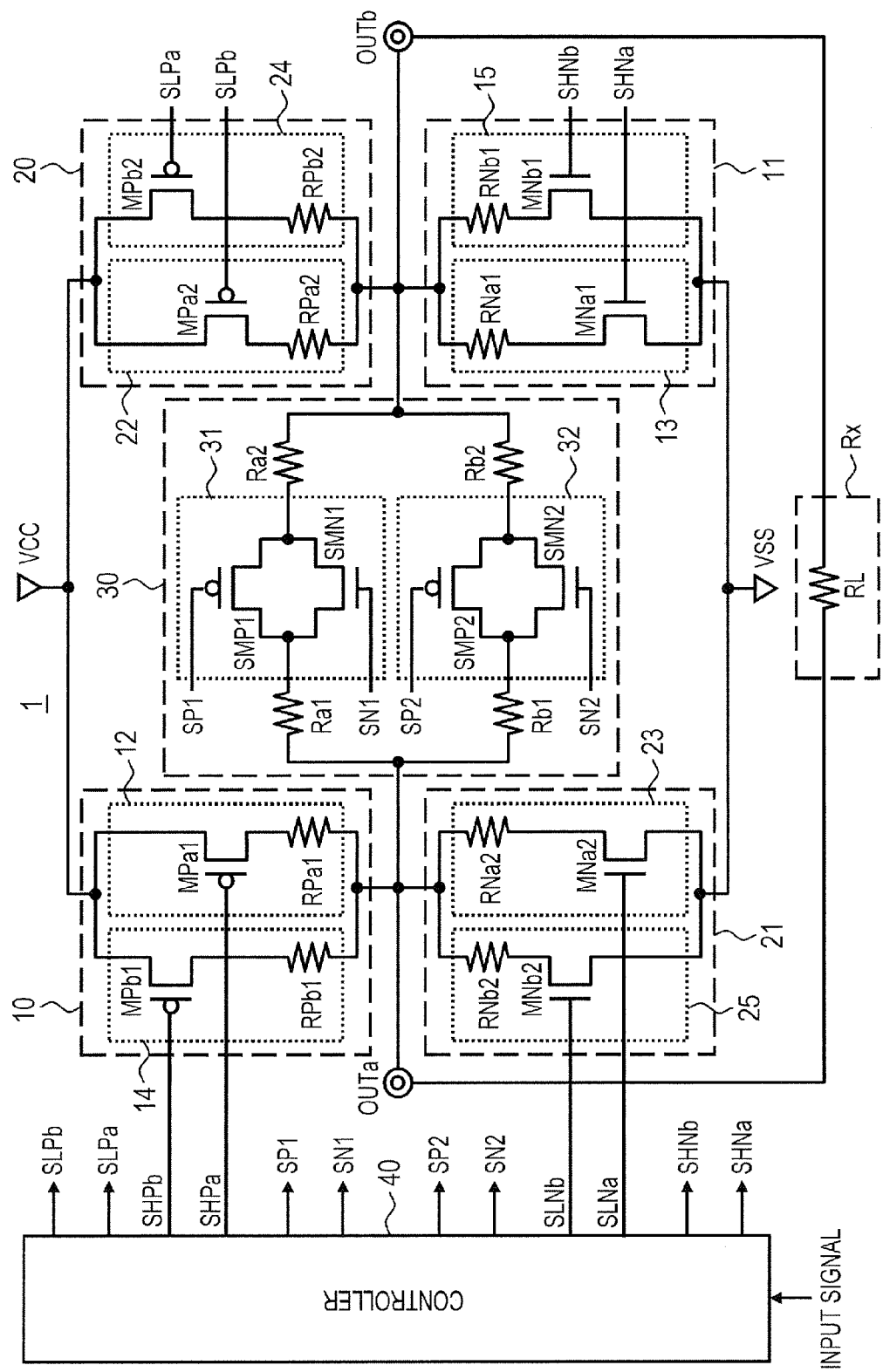
FIG. 1 is a block diagram illustrating a semiconductor device according to a first embodiment.

Hereinafter, embodiments of the present invention will be described with reference to the accompanying drawings. A block diagram of a semiconductor device 1 according to a first embodiment is illustrated in FIG. 1. FIG. 1 illustrates driver circuits and a controller that controls the driver circuits, which are intended by the present invention, in the semiconductor device. That is, the semiconductor device 1 includes a large number of circuits other than the driver circuit as blocks not shown. As illustrated in FIG. 1, the semiconductor device 1 includes a first driver 10, a second driver 11, a third driver 20, a fourth driver 21, a variable resistor 30, and a controller 40. The semiconductor device 1 also includes a first output terminal OUTa and a second output terminal OUTb. The semiconductor device 1 outputs a differential signal having an amplitude corresponding to an input signal through the first output terminal OUTa and the second output terminal OUTb. The differential signal is transmitted to a receiver circuit RX. The receiver circuit RX has a termination resistor (for example, load resistor RL) for receiving the differential signal.

The first driver 10 is disposed between a first supply terminal (for example, supply terminal applied with a supply voltage VCC, and hereinafter also referred to as "supply terminal VCC") and the first output terminal OUTa, and sets an output impedance thereof as a third resistance value in the emphasis mode and as a fourth resistance value larger than the third resistance value in the de-emphasis mode.

In more detail, the first driver 10 includes a first output setting unit 12 and a second output setting unit 14. The first output setting unit 12 includes a first switch transistor MPa1 and a first resistor RPa1 which are coupled in series between the supply terminal VCC and the first output terminal OUTa. The second output setting unit 14 includes a second switch transistor MPb1 and a second resistor RPb1 which are coupled in series between the supply terminal VCC and the first output terminal OUTa. The first switch transistor MPa1 and the second switch transistor MPb1 are each formed of a PMOS transistor. An output control signal SHPa output by the controller 40 is input to a gate of the first switch transistor MPa1. An output control signal SHPb output by the controller 40 is input to a gate of the second switch transistor MPb1.

The first resistor RPa1 includes the third resistance value. The third resistance value is the output impedance of the first driver 10 in the emphasis mode where the differential signal is subjected to the emphasis processing. The second resistor RPb1 has a resistance value in which a combined resistance of the second resistor RPb1 and the first resistor RPa1 becomes the fourth resistance value. The fourth resistance value is the output impedance of the first driver 10 in the de-emphasis mode where the differential signal is not subjected to the emphasis processing.

Also, the first switch transistor MPa1 is controlled in the conductive state in any mode of the emphasis mode and the de-emphasis mode according to the output control signal SHPa. The second switch transistor MPb1 is controlled in the conductive state in the emphasis mode according to the output control signal SHPb, and controlled in a non-conductive state in the de-emphasis mode.

The second driver 11 is disposed between a second supply terminal (for example, ground terminal applied with a ground voltage VSS, and hereinafter also referred to as "ground terminal VSS") and the second output terminal OUTb, and sets an output impedance thereof as a fifth resistance value in the emphasis mode and as a sixth resistance value larger than the fifth resistance value in the de-emphasis mode.

In more detail, the second driver 11 includes a second output setting unit 13 and a fourth output setting unit 15. The second output setting unit 13 includes a third switch transistor MNa1 and a third resistor RNa1 which are coupled in series between the ground terminal VSS and the second output terminal OUTb. The fourth output setting unit 15 includes a fourth switch transistor MNb1 and a fourth resistor RNb1 which are coupled in series between the ground terminal VSS and the second output terminal OUTb. The third switch transistor MNa1 and the fourth switch transistor MNb1 are each formed of an NMOS transistor. An output control signal SHNa output by the controller 40 is input to a gate of the third switch transistor MNa1. An output control signal SHNb output by the controller 40 is input to a gate of the fourth switch transistor MNb1.

The third resistor RNa1 includes the fifth resistance value. The fifth resistance value is the output impedance of the second driver 11 in the emphasis mode where the differential signal is subjected to the emphasis processing. The fourth resistor RNb1 has a resistance value in which a combined resistance of the fourth resistor RNb1 and the third resistor RNa1 becomes the sixth resistance value. The sixth resistance value is the output impedance of the second driver 11 in the de-emphasis mode where the differential signal is not subjected to the emphasis processing.

Also, the third switch transistor MNa1 is controlled in the conductive state in any mode of the emphasis mode and the de-emphasis mode according to the output control signal SHNa. The fourth switch transistor MNb1 is controlled in the conductive state in the emphasis mode according to the output control signal SHNb, and controlled in the non-conductive state in the de-emphasis mode.

The third driver 20 is disposed between the supply terminal VCC and the first output terminal OUTa, and sets an output impedance thereof as a seventh resistance value in the emphasis mode and as an eighth resistance value larger than the seventh resistance value in the de-emphasis mode.

In more detail, the third driver 20 includes a fifth output setting unit 22 and a sixth output setting unit 24. The fifth output setting unit 22 includes a fifth switch transistor MPa2 and a fifth resistor RPa2 which are coupled in series between the supply terminal VCC and the first output terminal OUTa. The sixth output setting unit 24 includes a sixth switch transistor MPb2 and a sixth resistor RPb2 which are coupled in series between the supply terminal VCC and the first output terminal OUTa. The fifth switch transistor MPa2 and the sixth switch transistor MPb2 are each formed of a PMOS transistor. An output control signal SLPa output by the controller 40 is input to a gate of the fifth switch transistor MPa2. An output control signal SLPb output by the controller 40 is input to a gate of the sixth switch transistor MPb2.

The fifth resistor RPa2 includes the seventh resistance value. The seventh resistance value is the output impedance of the third driver 20 in the emphasis mode where the differential signal is subjected to the emphasis processing. The sixth resistor RPb2 has a resistance value in which a combined resistance of the fifth resistor RPa2 and the sixth resistor RPb2 becomes the eighth resistance value. The eighth resistance value is the output impedance of the third driver 20 in the de-emphasis mode where the differential signal is not subjected to the emphasis processing.

Also, the fifth switch transistor MPa2 is controlled in the conductive state in any mode of the emphasis mode and the de-emphasis mode according to the output control signal SLPa. The sixth switch transistor MPb2 is controlled in the conductive state in the emphasis mode according to the output control signal SLPb, and controlled in the non-conductive state in the de-emphasis mode.

That is, the third driver 20 has the same circuit configuration as that of the first driver 10. However, the output control signals SLPa and SLPb input to the third driver 20 are different from the output control signals SHPa and SHPb input to the first driver 10. For example, the output control signals SLPa and SLPb activate the third driver 20 if the input signal is low level, and deactivate the third driver 20 if the input signal is high level. On the other hand, for example, the output control signals SHPa and SHPb activate the first driver 10 if the input signal is high level, and deactivate the first driver 10 if the input signal is low level. That is, the third driver 20 is controlled complementarily with the first driver 10.

The fourth driver 21 is disposed between the ground terminal VSS and the second output terminal OUTb, and sets an output impedance thereof as a ninth resistance value in the emphasis mode and as a tenth resistance value larger than the fifth resistance value in the de-emphasis mode.

In more detail, the fourth driver 21 includes a seventh output setting unit 23 and an eighth output setting unit 25. The seventh output setting unit 23 includes a seventh switch transistor MNa2 and a seventh resistor RNa2 which are coupled in series between the ground terminal VSS and the second output terminal OUTb. The eighth output setting unit 25 includes an eighth switch transistor MNb2 and an eighth resistor RNb2 which are coupled in series between the ground terminal VSS and the second output terminal OUTb. The seventh switch transistor MNa2 and the eighth switch transistor MNb2 are each formed of an NMOS transistor. An output control signal SLNa output by the controller 40 is input to a gate of the seventh switch transistor MNa2. An output control signal SLNb output by the controller 40 is input to a gate of the eighth switch transistor MNb2.

The seventh resistor RNa2 includes the ninth resistance value. The ninth resistance value is the output impedance of the fourth driver 21 in the emphasis mode where the differential signal is subjected to the emphasis processing. The eighth resistor RNb2 has a resistance value in which a combined resistance of the seventh resistor RNa2 and the seventh resistor RNa2 becomes the tenth resistance value. The tenth resistance value is the output impedance of the fourth driver 21 in the de-emphasis mode where the differential signal is not subjected to the emphasis processing.

Also, the seventh switch transistor MNa2 is controlled in the conductive state in any mode of the emphasis mode and the de-emphasis mode according to the output control signal SLNa. The eighth switch transistor MNb2 is controlled in the conductive state in the emphasis mode according to the output control signal SLNb, and controlled in the non-conductive state in the de-emphasis mode.

That is, the fourth driver 21 has the same circuit configuration as that of the second driver 11. However, the output control signals SLNa and SLNb input to the fourth driver 21 are different from the output control signals SHNa and SHNb input to the second driver 11. For example, the output control signals SLNa and SLNb activate the fourth driver 21 if the input signal is low level, and deactivate the fourth driver 21 if the input signal is high level. On the other hand, for example, the output control signals SHNa and SHNb activate the second driver 11 if the input signal is high level, and deactivate the second driver 11 if the input signal is low level. That is, the fourth driver 21 is controlled complementarily with the second driver 11.

The variable resistor 30 is disposed between the first output terminal OUTa and the second output terminal OUTb, and sets a resistance value thereof as a first resistance value in the emphasis mode, and as a second resistance value smaller than the first resistance value in the de-emphasis mode. The variable resistor 30 switches the resistance value between the first resistance value and the second resistance value according to switch control signals SP1, SP2, SN1, and SN2 output by the controller 40.

In more detail, the variable resistor 30 includes a first switch circuit 31, a second switch circuit 32, a first bridge resistor, and a second bridge resistor. The first switch circuit 31 and the first bridge resistor are coupled in series between the first output terminal OUTa and the second output terminal OUTb. In the example illustrated in FIG. 1, the first bridge resistor is configured by two resistors of a bridge resistor Ra1 and a bridge resistor Ra2. Also, the first switch circuit 31 has a PMOS transistor SMP1 and an NMOS transistor SMN1. The switch control signal SP1 is input to a gate of the PMOS transistor SMP1. The switch control signal SN1 is input to a gate of the NMOS transistor SMN1. The switch control signal SP1 and the switch control signal SN1 are signals of logic levels which are inverses of each other. The PMOS transistor SMP1 and the NMOS transistor SMN1 configure a transfer gate circuit. The bridge resistor Ra1 is disposed between one terminal of the first switch circuit 31 and the first output terminal OUTa, and the bridge resistor Ra2 is disposed between the other terminal of the first switch circuit 31 and the second output terminal OUTb.

The second switch circuit 32 and the second bridge resistor are coupled in series between the first output terminal OUTa and the second output terminal OUTb. In the example illustrated in FIG. 1, the second bridge resistor is configured by two resistors of two resistors of a bridge resistor Rb1 and a bridge resistor Rb2. Also, the second switch circuit 32 has a PMOS transistor SMP2 and an NMOS transistor SMN2. The switch control signal SP2 is input to a gate of the PMOS transistor SMP2. The switch control signal SN2 is input to a gate of the NMOS transistor SMN2. The switch control signal SP2 and the switch control signal SN2 are signals of logic levels which are inverses of each other. The PMOS transistor SMP2 and the NMOS transistor SMN2 configure a transfer gate circuit. The bridge resistor Rb2 is disposed between one terminal of the second switch circuit 32 and the first output terminal OUTa, and the bridge resistor Rb2 is disposed between the other terminal of the second switch circuit 32 and the second output terminal OUTb.

The switch control signals SP1 and SN1 maintain the first switch circuit 31 in the conductive state in a period where at least the semiconductor device 1 outputs the differential signal. On the other hand, the switch control signals SP2 and SN2 bring the second switch circuit 32 into the conductive state in a period where the semiconductor device 1 operates in the de-emphasis mode, and bring the second switch circuit 32 into the non-conductive state in a period where the semiconductor device 1 operates in the emphasis mode.

The controller 40 controls the conductive states of the first driver 10, the second driver 11, the third driver 20, and the fourth driver 21 according to the input signal. The controller 40 also switches the output impedances of the first driver 10, the second driver 11, the third driver 20, and the fourth driver 21, and the resistance value of the variable resistor 30 between the emphasis mode and the de-emphasis mode. In more detail, when the logic level of the input signal is switched, the controller 40 controls the first driver 10, the second driver 11, the third driver 20, the fourth driver 21, and the variable resistor 30 in the emphasis mode in a period of a subsequent one cycle. Also, when a period in which the input signal has the same logic level is continued for one cycle or longer, the controller 40 controls the first driver 10, the second driver 11, the third driver 20, the fourth driver 21, and the variable resistor 30 in the emphasis mode in a period of second and subsequent cycles. The number of cycles of the input signal for control in the emphasis mode can be appropriately set in conformity to the specification of the products. Also, in the first embodiment, the number of amplitude levels of the differential signal in the emphasis mode is set to one. Alternatively, the amplitude level of the differential signal in the emphasis mode may be divided into a plurality of stages for control.

Subsequently, the operation of the semiconductor device 1 will be described. First, the states of the circuits in the semiconductor device 1 in the emphasis mode and the de-emphasis mode will be described. Hereinafter, for simplification of description, the states of the circuits in the respective modes will be described with an example of the circuits of the first driver 10 and the second driver 11 among the drivers that are complementarily brought into the conductive state.

Figure 2:
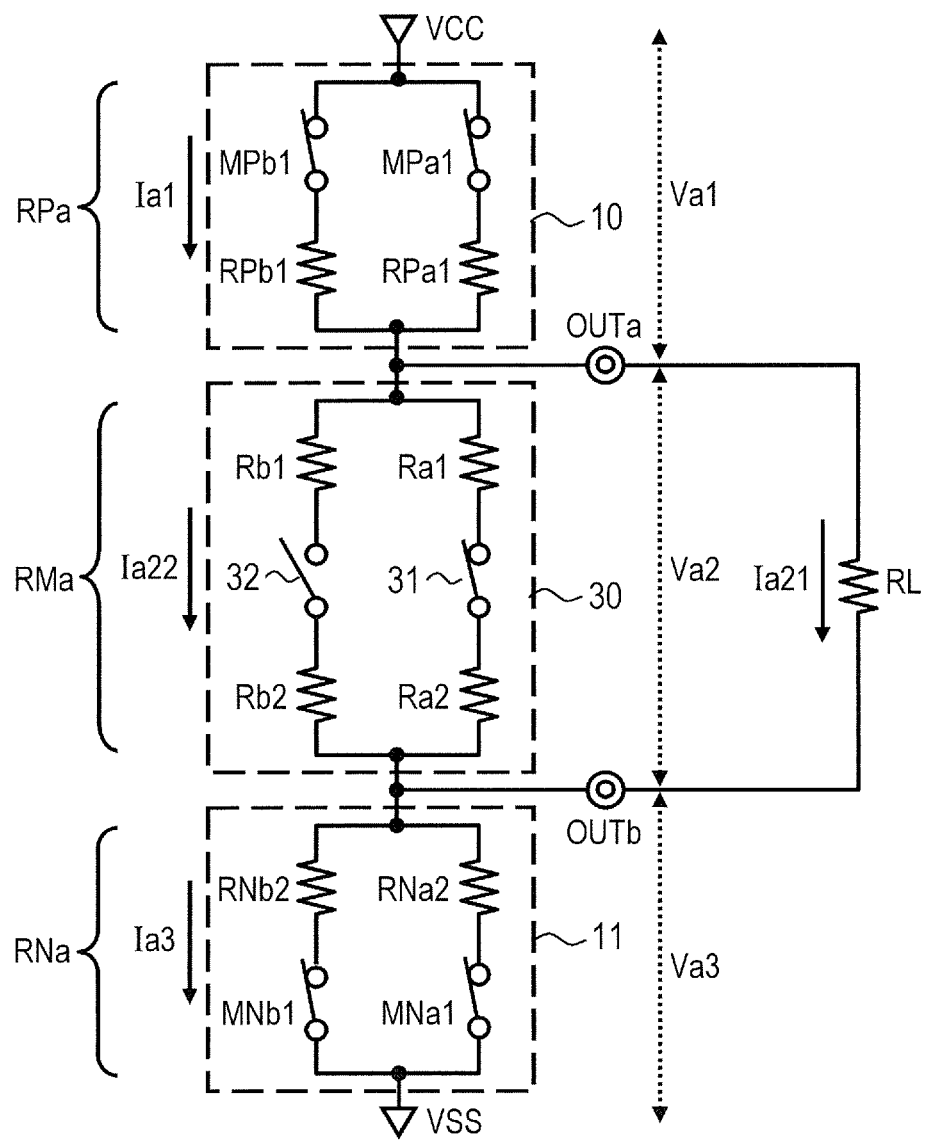
FIG. 2 is an equivalent circuit diagram illustrating the semiconductor device in an emphasis mode according to the first embodiment.

FIG. 2 illustrates an equivalent circuit diagram of the semiconductor device 1 in the emphasis mode. As illustrated in FIG. 2, in the emphasis mode, the first switch transistor MPa1 and the second switch transistor MPb1 are controlled in the conductive state. As a result, in the first driver 10, the first resistor RPa1 and the second resistor RPb1 are enabled. That is, a third resistance value RPa that is the output impedance of the first driver 10 in the emphasis mode is a combined resistance of the first resistor RPa1 and the second resistor RPb1.

Also, in the emphasis mode, the third switch transistor MNa1 and the fourth switch transistor MNb1 are controlled in the conduction state. As a result, in the second driver 11, the third resistor RNa1 and the fourth resistor RNb1 are enabled. That is, a fifth resistance value RNa that is the output impedance of the second driver 11 in the emphasis mode is a combined resistance of the third resistor RNa1 and the fourth resistor RNb1.

Also, in the emphasis mode, the first switch circuit 31 of the variable resistor 30 is controlled in the conductive state, and the second switch circuit 32 is controlled in the non-conductive state. As a result, in the variable resistor 30, the bridge resistors Ra1 and Ra2 configuring the first bridge resistor are enabled. The resistance value of the variable resistor 30 becomes equal to the resistance value of the first bridge resistor. That is, a first resistance value RMa that is the resistance value of the variable resistor 30 in the emphasis mode is the resistance value of the combined resistance (first bridge resistance) of the bridge resistors Ra1 and Ra2. Also, a resistance value between the first output terminal OUTa and the second output terminal OUTb is a combined resistance (that is, resistance value in which two resistors are coupled in parallel) of the first resistance value RMa and the resistance value of the load resistor RL.

Now, an amplitude Va2 of the differential signal in the emphasis mode will be described. As illustrated in FIG. 2, in the emphasis mode, a current Ia1 flows in the first driver 10, a current Ia3 flows in the second driver 11, a current Ia22 flows in the variable resistor 30, and a current Ia21 flows in the load resistor RL. A relationship of the respective currents can be represented by Expression (1).

$$Ia1=Ia3=Ia21+Ia22 \qquad (1)$$

Also, the current Ia21 and the current Ia22 have a relationship of Expression (2).

$$\frac{RMa}{RL} = \frac{Ia21}{Ia22} \quad (2)$$

A voltage Va1 between the supply terminal VCC and the first output terminal OUTa, a voltage Va2 between the first supply terminal OUTa and the second output terminal OUTb, and a voltage Va3 between the second output terminal OUTb and the ground terminal VSS can be represented by Expressions (3) to (5) from Expressions (1) and (2), respectively. The voltage Va2 corresponds to the amplitude of the differential signal in the emphasis mode.

$$Va1 = RPa*Ia1 \quad (3)$$

$$Va2 = RL*Ia21 = RMa*Ia22 \quad (4)$$

$$Va3 = RNa*Ia3 \quad (5)$$

Figure 3:
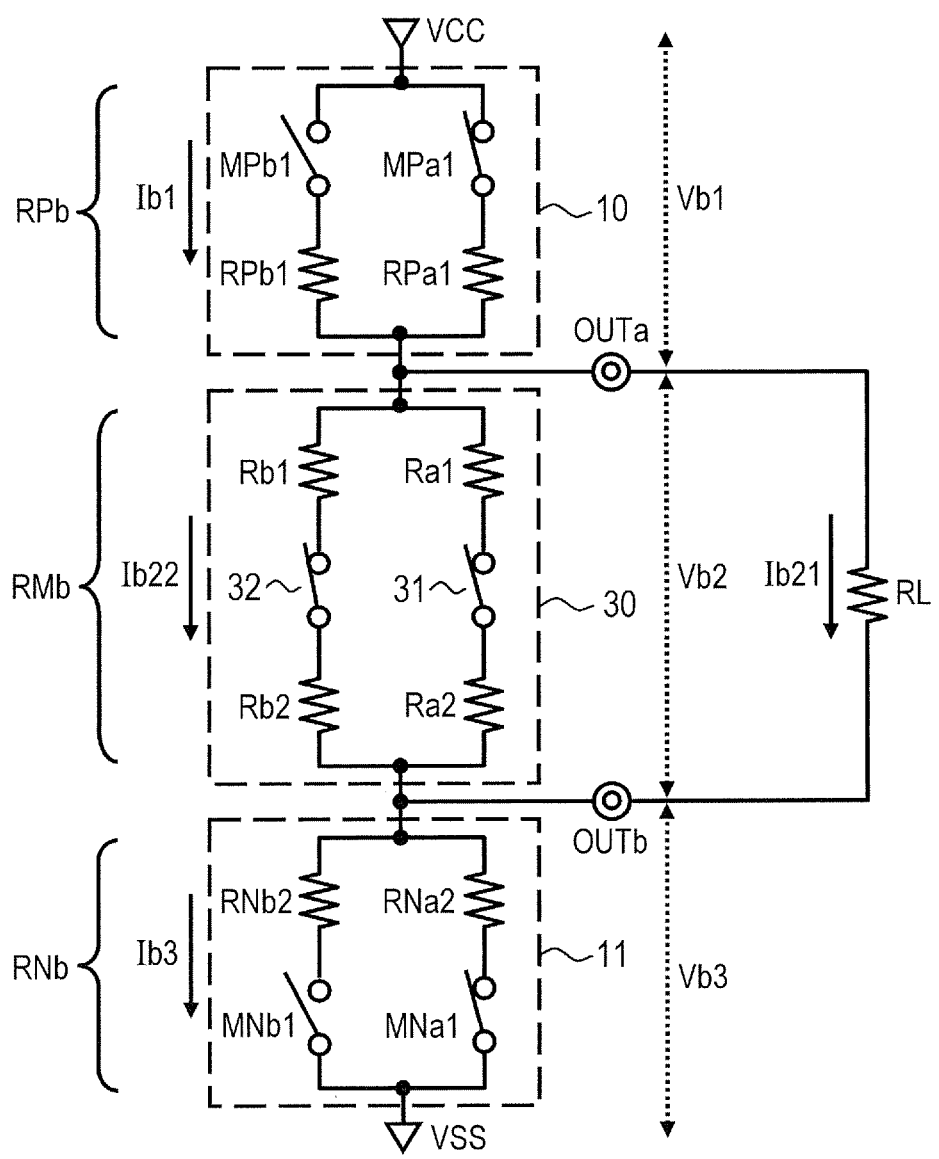
FIG. 3 is an equivalent circuit diagram illustrating the semiconductor device in a de-emphasis mode according to the first embodiment.

FIG. 3 illustrates an equivalent circuit diagram of the semiconductor device 1 in the de-emphasis mode. As illustrated in FIG. 3, in the de-emphasis mode, the first switch transistor MPa1 is controlled in the conductive state, and the second switch transistor MPb1 is controlled in the non-conductive state. As a result, in the first driver 10, the first resistor RPa1 is enabled, and the second resistor RPb1 is disabled. That is, a fourth resistance value RPb that is the output impedance of the first driver 10 in the de-emphasis mode is the resistance value of the first resistor RPa1.

Also, in the de-emphasis mode, the third switch transistor MNa1 is controlled in the conductive state, and the fourth switch transistor MNb1 is controlled in the non-conductive state. As a result, in the second driver 11, the third resistor RNa1 is enabled, and the fourth resistor RNb1 is disabled. That is, a sixth resistance value RNb that is the output impedance of the second driver 11 in the de-emphasis mode is the resistance value of the third resistor RNa1.

Also, in the de-emphasis mode, the first switch circuit 31 and the second switch circuit 32 in the variable resistor 30 are controlled in the conductive state. As a result, in the variable resistor 30, the bridge resistors Ra1 and Ra2 configuring the first bridge resistor and the bridge resistors Rb1 and Rb2 configuring the second bridge resistor are enabled. The resistance value of the variable resistor 30 becomes equal to the combined resistance of the first bridge resistor and the second bridge resistor. That is, a second resistance value RMb that is the resistance value of the variable resistor 30 in the de-emphasis mode is a combined resistance of the combined resistance (first bridge resistor) of the bridge resistors Ra1 and Ra2, and the combined resistance (second bridge resistor) of the bridge resistors Rb1 and Rb2. Also, a resistance value between the first output terminal OUTa and the second output terminal OUTb is a combined resistance (that is, resistance value in which two resistors are coupled in parallel) of the second resistance value RMb and the resistance value of the load resistor RL.

An amplitude Va2 of the differential signal in the de-emphasis mode will be described. As illustrated in FIG. 3, in the de-emphasis mode, a current Ib1 flows in the first driver 10, a current Ib3 flows in the second driver 11, a current Ib22 flows in the variable resistor 30, and a current Ib21 flows in the load resistor RL. A relationship of the respective currents can be represented by Expression (6).

$$Ib1 = Ib3 = Ib21 + Ib22 \quad (6)$$

Also, the current Ib21 and the current Ib22 have a relationship of Expression (7).

$$\frac{RMb}{RL} = \frac{Ib21}{Ib22} \quad (7)$$

A voltage Vb1 between the supply terminal VCC and the first output terminal OUTa, a voltage Vb2 between the first supply terminal OUTa and the second output terminal OUTb, and a voltage Vb3 between the second output terminal OUTb and the ground terminal VSS can be represented by Expressions (8) to (10) from Expressions (6) and (7), respectively. The voltage Vb2 corresponds to the amplitude of the differential signal in the de-emphasis mode.

$$Vb1 = RPb*Ib1 \quad (8)$$

$$Vb2 = RL*1b21 = RMb*Ib22 \quad (9)$$

$$Vb3 = RNb*Ib3 \quad (10)$$

Now, a description will be given in more detail of a relationship between the amplitude Va2 of the differential signal in the emphasis mode and the amplitude Vb2 of the differential signal in the de-emphasis mode in the semiconductor device 1 according to the first embodiment.

In the semiconductor device 1 according to the first embodiment, the third resistance value RPa of the first driver 10 in the emphasis mode and the fourth resistance value RPb of the first driver 10 in the de-emphasis mode have a relationship represented by Expression (11). The fifth resistance value RNa of the second driver 11 in the emphasis mode and the sixth resistance value RNb of the second driver 11 in the de-emphasis mode have a relationship represented by Expression (12). The first resistance value RMa of the variable resistor 30 in the emphasis mode and the second resistance value RMb of the variable resistor 30 in the de-emphasis mode have a relationship represented by Expression (13).

$$RPa < RPb \quad (11)$$

$$RMa > RMb \quad (12)$$

$$RNa < RNb \quad (13)$$

In the semiconductor device 1 according to the first embodiment, the amplitude Va2 of the differential signal in the emphasis mode and the amplitude Vb2 of the differential signal in the de-emphasis mode are set by the resistance value of the variable resistor 30 and the resistance value of the load resistor RL. In more detail, in the semiconductor device 1, the amplitude Va2 of the differential signal in the emphasis mode and the amplitude Vb2 of the differential signal in the de-emphasis mode are determined according to a relationship of Expression (14).

$$\frac{Vb2}{Va2} = \frac{(RMb // RL)}{(RMa // RL)} \quad (14)$$

That is, in the semiconductor device 1 according to the first embodiment, the first resistance value RMa and the second resistance value RMb are set to values so that a ratio between a first differential resistance value RDSa that is a combined resistance (for example, parallel resistance) of the first resistance value RMa and the load resistance RL, and a second differential resistance value RDSb that is a combined resistance (for example, parallel resistance) of the second resistance value RMb and the load resistance RL, corresponds to a ratio between the amplitude Va2 of the differential signal in the emphasis mode and the amplitude Vb2 of the differential signal in the de-emphasis mode.

On the other hand, the third resistance value RPa and the fifth resistance value RNa in the emphasis mode, and the fourth resistance value RPb and the sixth resistance value RNb in the de-emphasis mode are set to values that satisfy Expression (15).

$$\left.\begin{array}{l} RDa = RPa + RNa \\ RDb = RPb + RNb \\ \dfrac{(RDb - RDa)}{(RMa // RL)} = 1 - \dfrac{(RMb // RL)}{(RMa // RL)} \\ (RDb = RDa) = (RMa // RL) - (RMb // RL) \end{array}\right\} \quad (15)$$

That is, in the semiconductor device 1 according to the first embodiment, a difference between a first output resistance value RDa indicative of a combined resistance of the third resistance value RPa and the fifth resistance value RNa, and a second output resistance value RDb indicative of a combined resistance of the fourth resistance value RPb and the sixth resistance value RNb is set to a value corresponding to a difference between the first differential resistance value RDSa and the second differential resistance value RDSb.

When the mode is changed from the emphasis mode to the de-emphasis mode, the resistance value between the first output terminal OUTa and the second output terminal OUTb is changed from the first differential resistance value RDSa to the second differential resistance value RDSb. However, when the first resistance value to the sixth resistance value are set on the basis of Expression (15), a difference in the resistance value between the first differential resistance value RDSa and the second differential resistance value RDSb is compensated by a difference between the first output resistance value RDa and the second output resistance value RDb. That is, in the semiconductor device 1, in both of the emphasis mode and the de-emphasis mode, the resistance value between the first output terminal OUTa and the second output terminal OUTb is kept constant, and a variation between the current Ia1 (=Ia3) flowing in the semiconductor device 1 in the emphasis mode and the current Ib1 (=Ib3) flowing in the de-emphasis mode can be suppressed.

It is ideal that the difference between the current Ia1 in the emphasis mode and the current Ib1 in the de-emphasis mode is zero. However, the difference of about several % may occur between those two currents. In other words, the error between the current Ia1 and the current Ib1 is acceptable if the error falls within an allowable range of a supply voltage variation caused by the error between the current Ia1 and the current Ib1.

Figure 4:
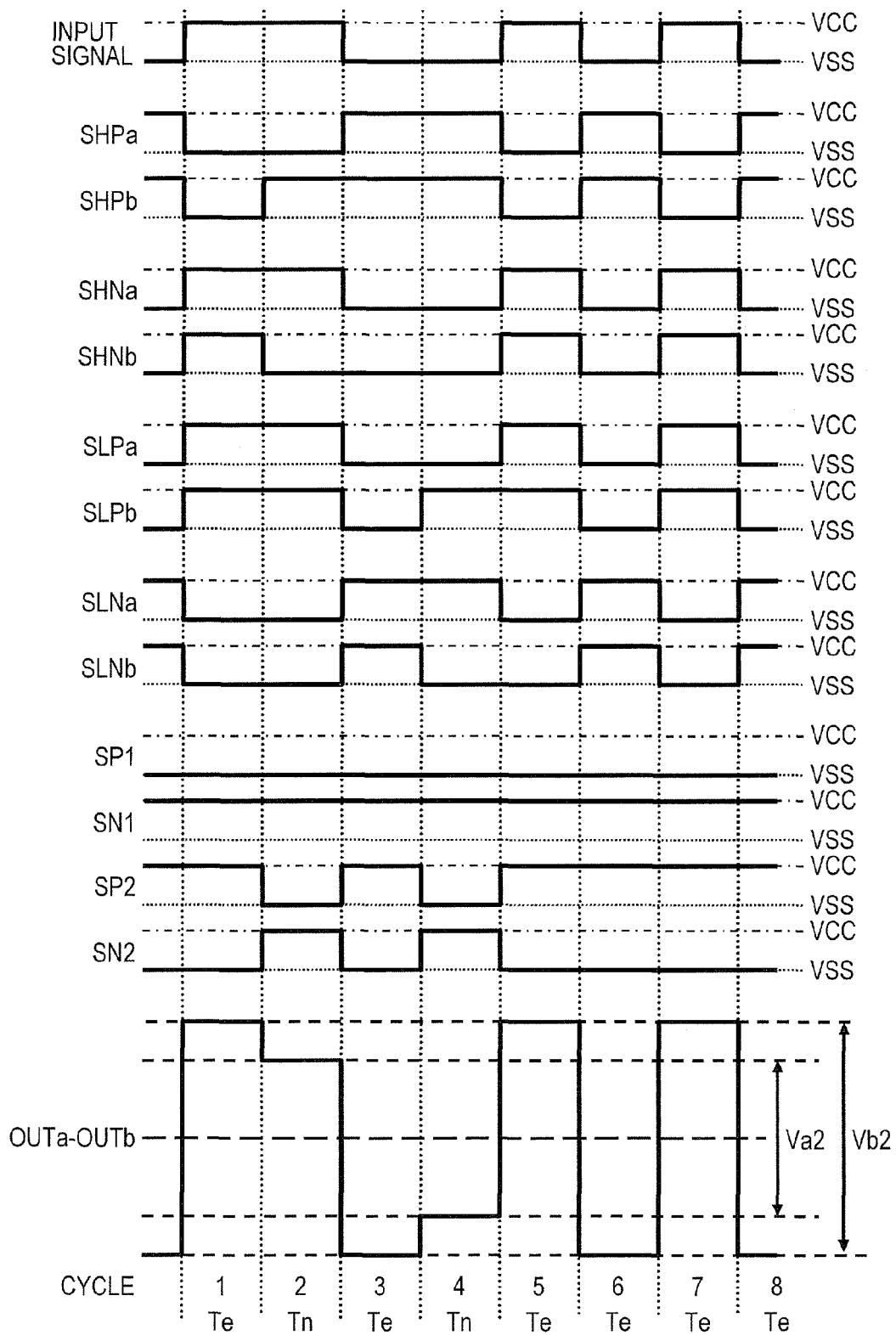
FIG. 4 is a timing chart illustrating the operation of the semiconductor device according to the first embodiment.

Subsequently, the operation of the semiconductor device 1 according to the first embodiment will be described. FIG. 4 is a timing chart illustrating the operation of the semiconductor device 1. In the following description, a unit of a period during which one value of the input signal is transmitted is called "cycle". As illustrated in FIG. 4, the semiconductor device 1 sets a voltage at the first output terminal OUTa to be higher than a voltage at the second output terminal OUTb if the signal level of the input signal is high level, and sets the voltage at the first output terminal OUTa to be lower than the voltage at the second output terminal OUTb if the signal level of the input signal is low level.

Also, the semiconductor device 1 controls the first driver 10 to the fourth driver 21 in the emphasis mode in a first cycle where the signal level of the input signal is switched. On the other hand, the semiconductor device 1 controls the first driver 10 to the fourth driver 21 in the de-emphasis mode in the periods of second and subsequent cycles if the same signal level of the input signal is continued for two or more cycles. In the example illustrated in FIG. 4, a period during which the controller 40 of the semiconductor device 1 controls the first driver 10 to the fourth driver 21 in the emphasis mode is denoted by symbol Te, and a period during which the controller 40 of the semiconductor device 1 controls the first driver 10 to the fourth driver 21 in the de-emphasis mode is denoted by symbol Tn.

As illustrated in FIG. 4, in the period where the input signal is high level, the semiconductor device 1 sets the output control signal SHPa to low level, the output control signal SHNa to high level, the output control signals SLPa and SLPb to low level, and the output control signals SHNa and SHNb to high level. As a result, in the period where the input signal is high level, the first driver 10 and the second driver 11 are brought into the conductive state (active state), and the third driver 20 and the fourth driver 21 are brought into the non-conductive state (inactive state). Further, the semiconductor device 1 sets the switch control signal SP1 to low level and the switch control signal SN1 to high level in the period where the input signal is high level. As a result, the first switch circuit 31 of the variable resistor 30 is brought into the conductive state, and the bridge resistors Ra1 and Ra2 are enabled.

The semiconductor device 1 sets the output control signal SHPb to low level, and the output control signal SHNb to high level in the period Te having the input signal of high level, and sets the output control signal SHPb to high level and the output control signal SHNb to low level in the period Tn. Also, the semiconductor device 1 sets the switch control signal SP2 to low level, and the switch control signal SN2 to high level in the period Te having the input signal of high level, and sets the switch control signal SP2 to high level and the switch control signal SN2 to low level in the period Tn.

As a result, the semiconductor device 1 decreases the output impedances of the first driver 10 and the second driver 11, and increases the resistance value of the variable resistor 30 in the period Te having the input signal of high level. The semiconductor device 1 increases the output impedances of the first driver 10 and the second driver 11, and decreases the resistance value of the variable resistor 30 in the period Tn. With such a change in the resistance value, the semiconductor device 1 realizes emphasis processing for making the amplitude Va2 of the differential signal in the period Te larger than the amplitude Vb2 of the differential signal in the period Tn.

On the other hand, as illustrated in FIG. 4, in the period where the input signal is low level, the semiconductor device 1 sets the output control signal SLPa to low level, the output control signal SLNa to high level, the output control signals SHPa and SHPb to high level, and the output control signals SHNa and SHNb to low level. As a result, in the period where the input signal is low level, the third driver 20 and the fourth driver 21 are brought into the conductive state (active state), and the first driver 10 and the second driver 11 are brought into the non-conductive state (inactive state). Further, the semiconductor device 1 sets the switch control signal SP1 to low level and the switch control signal SN1 to high level in the period where the input signal is low level. As a result, the first switch circuit 31 of the variable resistor 30 is brought into the conductive state, and the bridge resistors Ra1 and Ra2 are enabled.

The semiconductor device 1 sets the output control signal SLPb to low level and the output control signal SLNb to high level in the period Te having the input signal of low level, and sets the output control signal SLPb to high level and the output control signal SLNb to low level in the period Tn. Also, the semiconductor device 1 sets the switch control signal SP2 to low level, and the switch control signal SN2 to high level in the period Te having the input signal of low level, and sets the switch control signal SP2 to high level and the switch control signal SN2 to low level in the period Tn.

As a result, the semiconductor device 1 decreases the output impedances of the third driver 20 and the fourth driver 21, and increases the resistance value of the variable resistor 30 in the period Te having the input signal of low level. The semiconductor device 1 increases the output impedances of the third driver 20 and the fourth driver 21, and decreases the resistance value of the variable resistor 30 in the period Te having the input signal of low level. With such a change in the resistance value, the semiconductor device 1 realizes the emphasis processing for making the amplitude Va2 of the differential signal in the period Te larger than the amplitude Vb2 of the differential signal in the period Tn.

Accordingly, the semiconductor device 1 according to the first embodiment includes: the first output terminal OUTa and the second output terminal OUTb that are coupled with the load resistor RL, and output a differential signal; the variable resistor 30 that is disposed between the first output terminal OUTa and the second output terminal OUTb, and sets the resistance value thereof as the first resistance value RMa in the emphasis mode, and as the second resistance value RMb smaller than the first resistance value in the de-emphasis mode; the first driver 20 that is disposed between the supply terminal VCC and the first output terminal OUTa, and sets the output impedance thereof as the third resistance value RPa in the emphasis mode, and as the fourth resistance value RPb larger than the third resistance value in the de-emphasis mode; the second driver 11 that is disposed between the ground terminal VSS and the second output terminal OUTb, and sets the output impedance thereof as the fifth resistance value RNa in the emphasis mode, and as the sixth resistance value RNb larger than the fifth resistance value in the de-emphasis mode; and the controller 40 that controls the conductive states of the first and second drivers according to the input signal, and switches the output impedances of the first driver 10 and the second driver 11, and the resistance value of the variable resistor between the emphasis mode and the de-emphasis mode. The semiconductor device 1 includes the third driver 20 that is controlled complementally with the first driver 10, and the fourth driver 21 that is controlled complementally with the second driver 11.

In the semiconductor device 1 according to the first embodiment, the ratio between the first differential resistance value RDSa that is a combined resistance of the first resistance value RMa and the load resistance RL, and the second differential resistance value RDSa that is a combined resistance of the second resistance value RMa and the load resistance RL is set to a value corresponding to the ratio between the amplitude Va2 of the differential signal in the emphasis mode and the amplitude Vb2 of the differential signal in the de-emphasis mode. Also, in the semiconductor device 1, the difference between the first output resistance value RPa indicative of the combined resistance of the third resistance value RPa and the fifth resistance value RNa, and the second output resistance value RNb indicative of the combined resistance of the fourth resistance value RPb and the sixth resistance value RNb is set to a value corresponding to the difference between the first differential resistance value RDSa and the second differential resistance value RDSb.

Also, in another viewpoint, in the semiconductor device 1 according to the first embodiment, the first driver 10 to the fourth driver 21 allow a substantially constant current to flow in any mode while increasing the output impedance according to switching from the emphasis mode to the de-emphasis mode. Also, the variable resistor 30 varies the resistance value thereof so that the current flowing in the load resistor RL decreases according to the switching from the emphasis mode to the de-emphasis mode.

With the above configuration of the semiconductor device 1 according to the first embodiment, the difference between the current Ia1 flowing from the first driver 10 through the fourth driver 21 in the emphasis mode, and the current Ib1 flowing from the first driver 10 through the fourth driver 21 in the de-emphasis mode can be reduced. With the reduction in the difference of the current consumption between the emphasis mode and the de-emphasis mode, the semiconductor device 1 can suppress the variation in the supply voltage when switching the mode between the emphasis mode and the de-emphasis mode. Also, with the suppression of the variation in the supply voltage, the semiconductor device 1 according to the first embodiment can improve the jitter characteristic of the differential signal.

Also, the variation in the supply voltage may cause a drawback of another circuit within the semiconductor device 1 not illustrated in FIG. 1. However, in the semiconductor device 1 according to the first embodiment, because the variation in the supply voltage can be suppressed, the drawback in another circuit within the semiconductor device 1 can be avoided.

Also, in order to suppress the variation in the supply voltage, a countermeasure such as the provision of a decoupling capacitor in the supply wiring is taken. However, if the decoupling capacitor is mounted in the semiconductor device 1, there arises such a problem that a chip area is increased. An increase in the chip area causes advantages that the manufacturing yield is deteriorated, and the costs increase. On the other hand, in the semiconductor device 1 according to the first embodiment, a variation in the supply voltage can be suppressed without using the decoupling capacitor. For that reason, the semiconductor device 1 according to the first embodiment can reduce the chip area more than that of a general semiconductor device that provides measures against the variation in the supply voltage by the decoupling capacitor.

In FIG. 1, the load resistor RL is coupled between the first output terminal OUTa and the second output terminal OUTb. However, another coupling configuration is proposed as the coupling configuration of the load resistor RL. Therefore, a block diagram of a semiconductor device 1a which is a modified example of the semiconductor device 1 according to the first embodiment is illustrated in FIG. 5.

Figure 5:
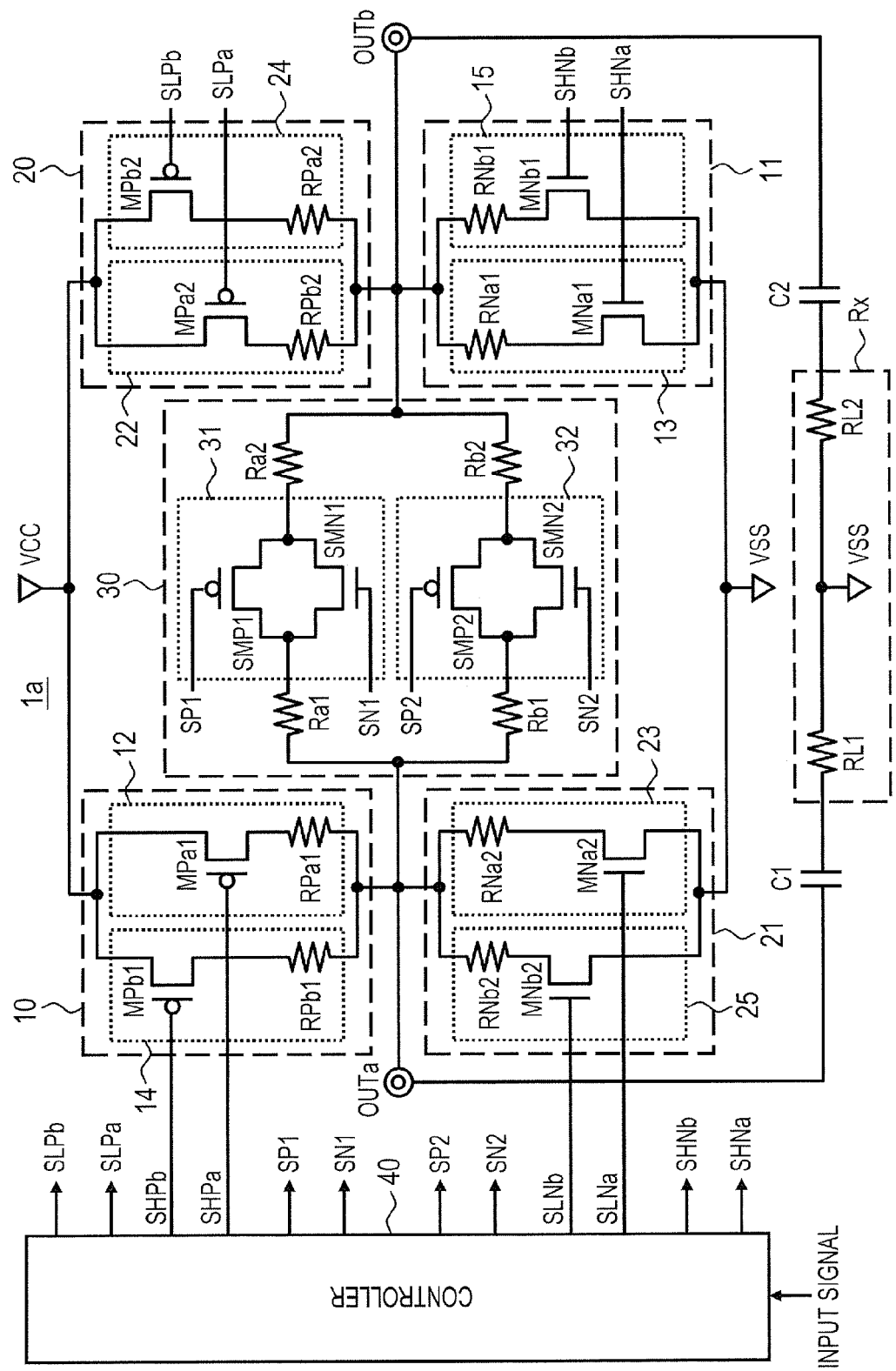
FIG. 5 is a block diagram illustrating a modified example of the semiconductor device according to the first embodiment.

As illustrated in FIG. 5, a semiconductor device 1a outputs a differential signal to the receiver circuit RX through capacitors C1 and C2. In this case, as the load resistor RL, load resistors RL1 and RL2 are provided in correspondence with the capacitors C1 and C2. One terminals of the load resistors RL1 and RL2 are coupled to the ground terminal VSS. With this coupling configuration, only an AC component of the differential signal can be transmitted to the receiver circuit RX. Even in the semiconductor device 1a, because the load resistors RL1 and RL2 can be regarded as one load resistor from the viewpoint of the AC property, the resistance value can be calculated in the same method as the method of calculating the resistance value described in Expressions (1) to (15).

Second Embodiment

Figure 6:
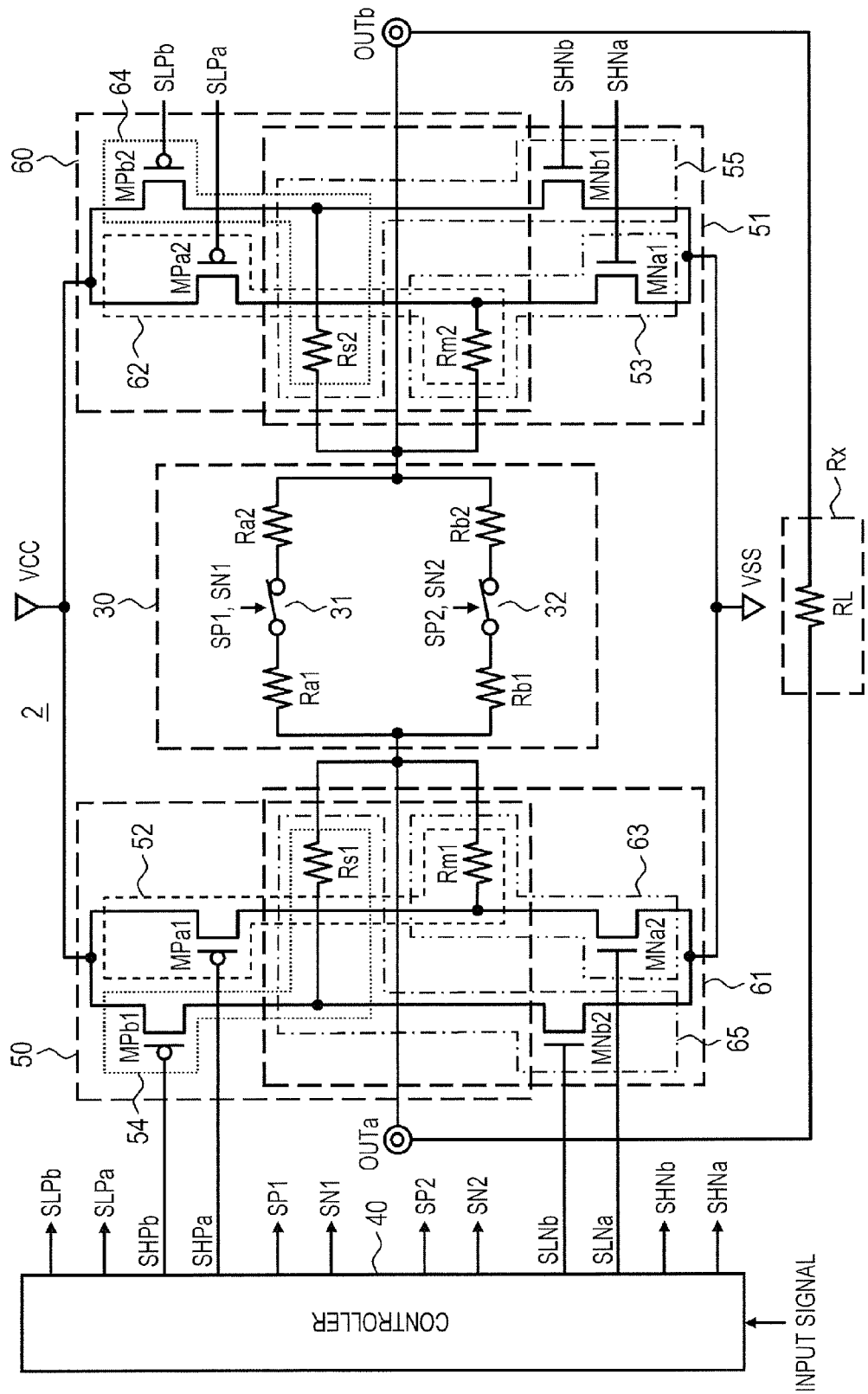
FIG. 6 is a block diagram illustrating a semiconductor device according to a second embodiment.

A block diagram of a semiconductor device 2 according to a second embodiment is illustrated in FIG. 6. In the semiconductor device 1 according to the first embodiment, each of the plural drivers has the resistors for determining the output impedance in the conductive state. However, as illustrated in FIG. 6, in the semiconductor device 2 according to the second embodiment, a pair of resistors is shared by two drivers.

Therefore, the semiconductor device 2 includes a first driver 50, a second driver 51, a third driver 60, and a fourth driver 61 as other configurations of the first driver 10, the second driver 11, the third driver 20, and the fourth driver 21.

The first driver 50 includes a first output setting unit 52 and a second output setting unit 54. Also, the fourth driver 61 includes a seventh output setting unit 63 and an eighth output setting unit 65.

The first output setting unit 52 includes the first switch transistor MPa1 and a resistor Rm1. The seventh output setting unit 63 includes the seventh switch transistor MNa2 and the resistor Rm1. That is, the resistor Rm1 is shared by the first output setting unit 52 and the seventh output setting unit 63.

Also, the second output setting unit 54 includes the second switch transistor MPb1 and a resistor Rs1. The eighth output setting unit 65 includes the eighth switch transistor MNb2 and the resistor Rs1. That is, the resistor Rs1 is shared by the second output setting unit 54 and the eighth output setting unit 65.

The coupling configuration of the respective elements configuring the first driver 50 and the fourth driver 61 will be described. A source of the first switch transistor MPa1 is coupled to the supply terminal VCC. A drain of the first switch transistor MPa1 is coupled to a drain of the seventh switch transistor MNa2. A source of the seventh switch transistor MNa2 is coupled to the ground terminal VSS. The output control signal SHPa output by the controller 40 is input to a gate of the first switch transistor MPa1. The output control signal SLNa output by the controller 40 is input to a gate of the seventh switch transistor MNa2. Then, the resistor Rm1 is coupled between a node coupling the drain of the first switch transistor MPa1 and the drain of the seventh switch transistor MNa2, and the first output terminal OUTa.

A source of the second switch transistor MPb1 is coupled to the supply terminal VCC. A drain of the second switch transistor MPb1 is coupled to a drain of the eighth switch transistor MNb2. A source of the eighth switch transistor MNb2 is coupled to the ground terminal VSS. The output control signal SHPb output by the controller 40 is input to the gate of the second switch transistor MPb1. The output control signal SLNb output by the controller 40 is input to a gate of the eighth switch transistor MNb2. The resistor Rs1 is coupled between a node coupling the drain of the second switch transistor MPb1 and the drain of the eighth switch transistor MNb2, and the first output terminal OUTa.

Also, a third output setting unit 53 includes the third switch transistor MNa1 and a resistor Rm2. A fifth output setting unit 62 includes the fifth switch transistor MPa2 and the resistor Rm2. That is, the resistor Rm2 is shared by the third output setting unit 53 and the fifth output setting unit 62.

The second driver 51 includes the third output setting unit 53 and a fourth output setting unit 55. Also, the third driver 60 includes the fifth output setting unit 62 and a sixth output setting unit 64.

The third output setting unit 53 includes the third switch transistor MNa1 and the resistor Rm2. The fifth output setting unit 62 includes the fifth switch transistor MPa2 and the resistor Rm2. That is, the resistor Rm2 is shared by the third output setting unit 53 and the fifth output setting unit 62.

Also, the fourth output setting unit 55 includes the fourth switch transistor MNb1 and a resistor Rs2. The sixth output setting unit 64 includes the sixth switch transistor MPb2 and the resistor Rs2. That is, the resistor Rs2 is shared by the fourth output setting unit 55 and the sixth output setting unit 64.

The coupling configuration of the respective elements configuring the second driver 51 and the third driver 60 will be described. A source of the third switch transistor MNa1 is coupled to the ground terminal VSS. A drain of the third switch transistor MNa1 is coupled to a drain of the fifth switch transistor MPa2. A source of the fifth switch transistor MPa2 is coupled to the supply terminal VCC. The output control signal SHNa output by the controller 40 is input to a gate of the third switch transistor MNa1. The output control signal SLPa output by the controller 40 is input to a gate of the fifth switch transistor MPa2. Then, the resistor Rm2 is coupled between a node coupling the drain of the third switch transistor MNa1 and the drain of the fifth switch transistor MPa2, and the second output terminal OUTb.

A source of the fourth switch transistor MNb1 is coupled to the ground terminal VSS. A drain of the fourth switch transistor MNb1 is coupled to a drain of the sixth switch transistor MPb2. A source of the sixth switch transistor MPb2 is coupled to the supply terminal VCC. The output control signal SHNb output by the controller 40 is input to the gate of the fourth switch transistor MNb1. The output control signal SLPb output by the controller 40 is input to a gate of the sixth switch transistor MPb2. The resistor Rs2 is coupled between a node coupling the drain of the fourth switch transistor MNb1 and the drain of the sixth switch transistor MPb2, and the second output terminal OUTb.

The resistance values of the resistors Rm1, Rm2, Rs1, and Rs2 will be described. A combined resistance of the resistor Rm1 and the resistor Rs1 represents a resistance value corresponding to the third resistance value RPa in a state where the first driver 50 and the second driver 51 are activated in the emphasis mode. Similarly, in a state where the third driver 60 and the fourth driver 61 are activated in the emphasis mode, a combined resistance of the resistor Rm1 and the resistor Rs1 represents a resistance value corresponding to the third resistance value RPa.

A combined resistance of the resistor Rm2 and the resistor Rs2 represents a resistance value corresponding to the fifth resistance value RNa in a state where the first driver 50 and the second driver 51 are activated in the emphasis mode. Similarly, in a state where the third driver 60 and the fourth driver 61 are activated in the emphasis mode, a combined resistance of the resistor Rm2 and the resistor Rs2 represents a resistance value corresponding to the fifth resistance value RNa.

Also, the resistor Rm1 represents a resistance value corresponding to the fifth resistance value RPb in a state where the first driver 50 and the second driver 51 are activated in the de-emphasis mode. Similarly, in a state where the third driver 60 and the fourth driver 61 are activated in the de-emphasis mode, the resistor Rm1 represents a resistance value corresponding to the fifth resistance value RPb.

Also, the resistor Rm2 represents a resistance value corresponding to the sixth resistance value RNb in a state where the first driver 50 and the second driver 51 are activated in the de-emphasis mode. Similarly, in a state where the third driver 60 and the fourth driver 61 are activated in the de-emphasis mode, the resistor Rm2 represents a resistance value corresponding to the sixth resistance value RNb.

From the above description, the semiconductor device 2 according to the second embodiment realizes the third to sixth resistance values by the resistors shared by the respective drivers. Also, in the semiconductor device 2, as is understood from a fact that the same control signals as those in the semiconductor device 1 according to the first embodiment is used for control, the drivers can be controlled by the same control as that in the semiconductor device according to the first embodiment. The resistors are shared by the plurality of drivers so that the semiconductor device 2 according to the second embodiment can be reduced in the number of circuit elements more than the semiconductor device 1. Also, the number of circuit elements is reduced so that the semiconductor device 2 according to the semiconductor device 2 can reduce the chip area more than that of the semiconductor device 1.

Third Embodiment

Figure 7:
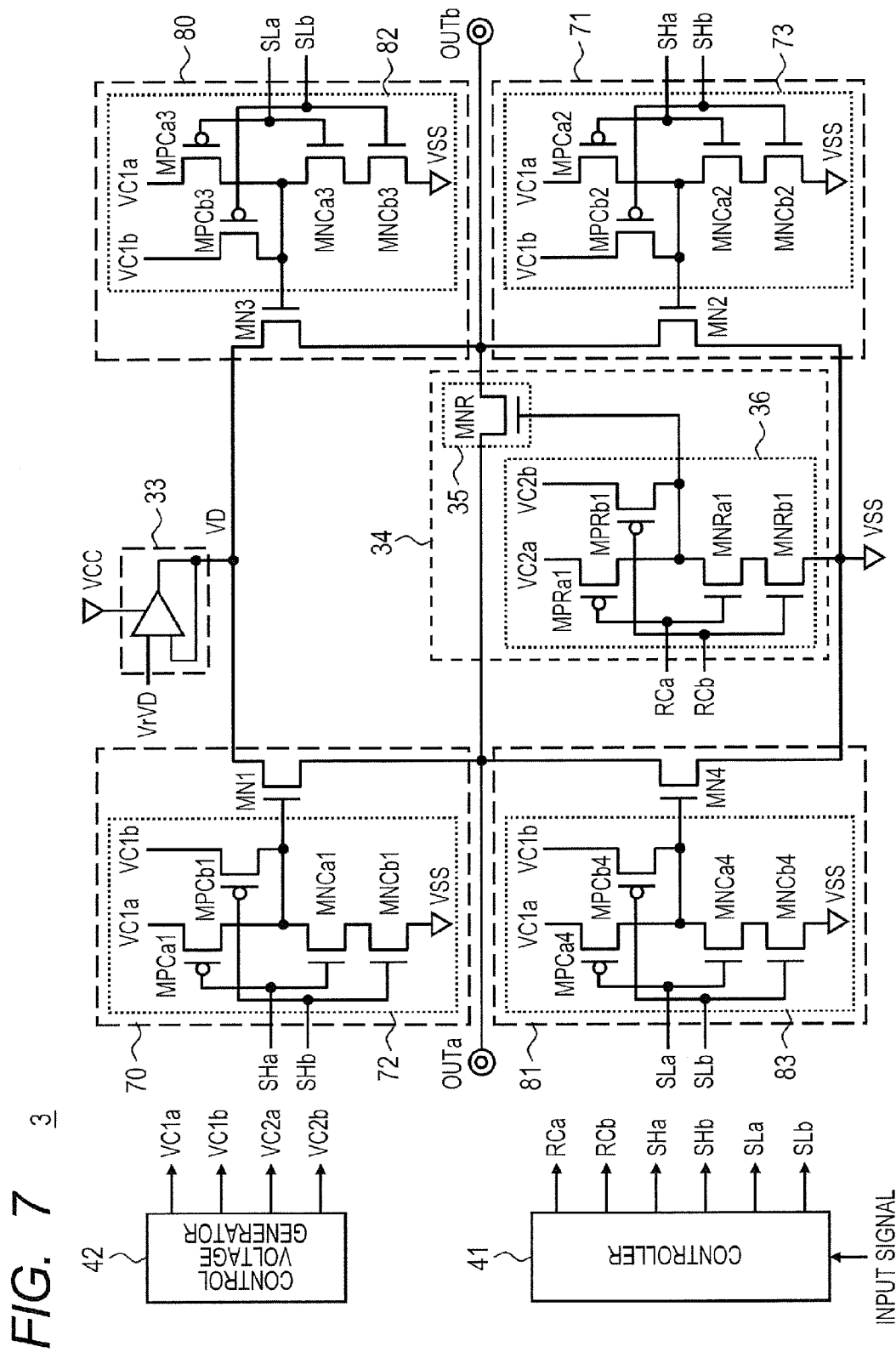
FIG. 7 is a block diagram illustrating a semiconductor device according to a third embodiment.

A block diagram of a semiconductor device 3 according to a third embodiment is illustrated in FIG. 7. In the first and second embodiments, whether the drivers are activated, or not, is conducted by switching between on and off of the transistors. The resistance value for determining the amplitude of the differential signal is determined by the resistive elements. On the other hand, in the third embodiment, the active state of each driver is controlled by the aid of an on-resistance of the transistor. The amplitude of the differential signal is determined according to the on-resistance of the activated transistor.

As illustrated in FIG. 7, the semiconductor device 3 includes a first driver 70, a second driver 71, a third driver 80, a fourth driver 81, a regulator circuit 33, a variable resistor 34, a controller 41, and a control voltage generator 42. In the semiconductor device 3, the regulator circuit 33 is provided. The regulator circuit 33 outputs the same voltage as a reference voltage VrVD applied from another circuit not shown as a supply voltage VD. The supply voltage VD is applied to the first driver 70 to fourth driver 81. The supply voltage VD has a voltage value lower than the supply terminal VCC given from the supply terminal VCC. If a difference between an amplitude of the differential signal output by the semiconductor device 3 and the supply terminal VCC is larger, the regulator circuit 33 operates the first driver 70 to fourth driver 81 by the supply voltage VD, thereby enabling the power consumption to be reduced. In the semiconductor device 3, the output terminal of the regulator circuit 33 is used as the first supply terminal.

Also, if the amplitude of the differential signal is sufficiently smaller than the supply terminal VCC, gate-source voltages Vgs of drive transistors (drive transistors MN1 to MN4 in the following description) in the drivers can be sufficiently larger than source-drain voltages Vsd of the drive transistors. When a relationship between the gate-source voltages Vgs and the source-drain voltages Vsd is thus set, the on-resistance of the drive transistor can be controlled in an area where the resistance value is linearly changed. As a result, in the third embodiment, NMOS transistors are used for push switches (for example, first driver and third driver), and the control of the gate-source voltages Vgs can be commonalized by pull switches (second driver and fourth driver).

Also, the first driver 70 to the fourth driver 81 in the semiconductor device 3 show a modified example of a circuit for realizing the functions of the first driver 10 to the fourth driver 21 in the semiconductor device 1. The variable resistor 34 in the third embodiment shows a modified example of a circuit for realizing the same function as that of the variable resistor 30 in the semiconductor device 1. Also, the controller 41 generates a variety of control signals for controlling the output impedances of the drivers and the resistance value of the variable resistor. The control signals output by the controller 41 allows the drivers and the variable resistor to generate a differential signal so as to make a correspondence relationship between the signal level of the input signal and the signal level of the differential signal identical with that in the first embodiment. Also, the control voltage generator 42 generates resistance setting voltages VC1a, VC1b, VC2a, and VC2b used to set the resistance values of the drivers and the variable resistor in the semiconductor device 3.

The first driver 70 includes a first drive transistor MN1 and a first drive state controller 72. The first drive transistor MN1 is coupled between the first supply terminal (for example, output terminal of regulator circuit 33) and the first output terminal OUTa. The first drive state controller 72 applies a third resistance setting voltage (for example resistance setting voltage VC1a) to a gate of the first drive transistor MN1 in the emphasis mode, with the resistance value between the source and the drain of the first drive transistor MN1 as the third resistance value RPa. Also, the first drive state controller 72 applies a fourth resistance setting voltage (for example resistance setting voltage VC1b) to a gate of the first drive transistor MN1 in the de-emphasis mode, with the resistance value between the source and the drain of the first drive transistor MN1 as the fourth resistance value RPb.

In more detail, the first drive state controller 72 includes a PMOS transistor MPCa1, a PMOS transistor MPCb1, an NMOS transistor MNCa1, and an NMOS transistor MNCb1. The resistance setting voltage VC1a is applied to a source of the PMOS transistor MPCa1. The source of the PMOS transistor MPCa1 is coupled to a gate of the first drive transistor MN1. An output control signal SHa is supplied to the gate of the PMOS transistor MPCa1. The resistance setting voltage VC1b is applied to a source of the PMOS transistor MPCb1. A drain of the PMOS transistor MPCb1 is coupled to the gate of the first drive transistor MN1. An output control signal SHb is supplied to a gate of the PMOS transistor MPCb1.

A drain of the NMOS transistor MNCa1 is coupled to the gate of the first drive transistor MN1. A source of the NMOS transistor MNCa1 is coupled to a drain of the NMOS transistor MNCb1. The output control signal SHa is supplied to a gate of the NMOS transistor MNCa1. The drain of the NMOS transistor MNCb1 is coupled to the source of the NMOS transistor MNCa1. The ground voltage VSS is applied to a source of the NMOS transistor MNCb1. The output control signal SHb is supplied to a gate of the NMOS transistor MNCb1.

That is, the first drive state controller 72 applies the resistance setting voltage VC1a to the gate of the first drive transistor MN1 in a period where the output control signal SHa is low level, and applies the resistance setting voltage VC1b to the gate of the first drive transistor MN1 in a period where the output control signal SHb is low level. Also, the first drive state controller 72 applies the ground voltage VSS to the gate of the first drive transistor MN1 in a period where both of the output control signal SHa and the output control signal SHb are high level. The output control signal SHa and the output control signal SHb are so generated as not to be low level at the same time.

The first driver 70 sets the resistance value of the first drive transistor MN1 as the third resistance value RPa according to the resistance setting voltage VC1a in the emphasis mode by the operation of the first drive state controller 72. The first driver 70 sets the resistance value of the first drive transistor MN1 as the fourth resistance value RPb according to the resistance setting voltage VC1b in the de-emphasis mode by the operation of the first drive state controller 72. Also, the first driver 70 blocks the first drive transistor MN1 in a nonconductive state (for example, inactive state) by the operation of the first drive state controller 72.

The second driver 71 includes a second drive transistor MN2 and a second drive state controller 73. The second drive transistor MN2 is coupled between the ground terminal VSS and the second output terminal OUTb. The second drive state controller 73 applies a fifth resistance setting voltage (for example resistance setting voltage VC1a) to a gate of the second drive transistor MN2 in the emphasis mode, with the resistance value between the source and the drain of the second drive transistor MN2 as the fifth resistance value RNa. Also, the second drive state controller 73 applies a sixth resistance setting voltage (for example resistance setting voltage VC1b) to a gate of the second drive transistor MN2 in the de-emphasis mode, with the resistance value between the source and the drain of the second drive transistor MN2 as the sixth resistance value RNb.

In more detail, the second drive state controller 73 includes a PMOS transistor MPCa2, a PMOS transistor MPCb2, an NMOS transistor MNCa2, and an NMOS transistor MNCb2.

The resistance setting voltage VC1a is applied to a source of the PMOS transistor MPCa2. The source of the PMOS transistor MPCa2 is coupled to a gate of the second drive transistor MN2. An output control signal SHa is supplied to the gate of the PMOS transistor MPCa2. The resistance setting voltage VC1b is applied to a source of the PMOS transistor MPCb2. A drain of the PMOS transistor MPCb2 is coupled to the gate of the second drive transistor MN2. An output control signal SHb is supplied to a gate of the PMOS transistor MPCb2.

A drain of the NMOS transistor MNCa2 is coupled to the gate of the second drive transistor MN2. A source of the NMOS transistor MNCa2 is coupled to a drain of the NMOS transistor MNCb2. The output control signal SHa is supplied to a gate of the NMOS transistor MNCa2. The drain of the NMOS transistor MNCb2 is coupled to the source of the NMOS transistor MNCa2. The ground voltage VSS is applied to a source of the NMOS transistor MNCb2. The output control signal SHb is supplied to a gate of the NMOS transistor MNCb2.

That is, the second drive state controller 73 applies the resistance setting voltage VC1a to the gate of the second drive transistor MN2 in the period where the output control signal SHa is low level, and applies the resistance setting voltage VC1b to the gate of the second drive transistor MN2 in the period where the output control signal SHb is low level. Also, the second drive state controller 73 applies the ground voltage VSS to the gate of the second drive transistor MN2 in the period where both of the output control signal SHa and the output control signal SHb are high level.

The second driver 71 sets the resistance value of the second drive transistor MN2 as the fifth resistance value RNa according to the resistance setting voltage VC1a in the emphasis mode by the operation of the second drive state controller 73. The second driver 71 sets the resistance value of the second drive transistor MN2 as the sixth resistance value RNb according to the resistance setting voltage VC1b in the de-emphasis mode by the operation of the second drive state controller 73. Also, the second driver 71 blocks the second drive transistor MN2 in a non-conductive state (for example, inactive state) by the operation of the second drive state controller 73.

The third driver 80 includes a third drive transistor MN3 and a third drive state controller 82. The third drive transistor MN3 is coupled between the output terminal of the regulator circuit 33 and the second output terminal OUTb. The third drive state controller 82 applies a third resistance setting voltage (for example resistance setting voltage VC1a) to a gate of the third drive transistor MN3 in the emphasis mode, with the resistance value between the source and the drain of the third drive transistor MN3 as the third resistance value RPa. Also, the third drive state controller 82 applies a fourth resistance setting voltage (for example resistance setting voltage VC1b) to a gate of the third drive transistor MN3 in the de-emphasis mode, with the resistance value between the source and the drain of the third drive transistor MN3 as the fourth resistance value RPb.

In more detail, the third drive state controller 82 includes a PMOS transistor MPCa3, a PMOS transistor MPCb3, an NMOS transistor MNCa3, and an NMOS transistor MNCb3.

The resistance setting voltage VC1a is applied to a source of the PMOS transistor MPCa3. The source of the PMOS transistor MPCa3 is coupled to a gate of the third drive transistor MN3. An output control signal SLa is supplied to the gate of the PMOS transistor MPCa3. The resistance setting voltage VC1b is applied to a source of the PMOS transistor MPCb3. A drain of the PMOS transistor MPCb3 is coupled to the gate of the third drive transistor MN3. An output control signal SLb is supplied to a gate of the PMOS transistor MPCb3.

A drain of the NMOS transistor MNCa3 is coupled to the gate of the third drive transistor MN3. A source of the NMOS transistor MNCa3 is coupled to a drain of the NMOS transistor MNCb3. The output control signal SLa is supplied to a gate of the NMOS transistor MNCa3. The drain of the NMOS transistor MNCb3 is coupled to the source of the NMOS transistor MNCa3. The ground voltage VSS is applied to a source of the NMOS transistor MNCb3. The output control signal SLb is supplied to a gate of the NMOS transistor MNCb3.

That is, the third drive state controller 82 applies the resistance setting voltage VC1a to the gate of the third drive transistor MN3 in the period where the output control signal SLa is low level, and applies the resistance setting voltage VC1b to the gate of the third drive transistor MN3 in the period where the output control signal SLb is low level. Also, the third drive state controller 82 applies the ground voltage VSS to the gate of the third drive transistor MN3 in the period where both of the output control signal SLa and the output control signal SLb are high level.

The third driver 80 sets the resistance value of the third drive transistor MN3 as the third resistance value RPa according to the resistance setting voltage VC1a in the emphasis mode by the operation of the third drive state controller 82. The third driver 80 sets the resistance value of the third drive transistor MN3 as the fourth resistance value RPb according to the resistance setting voltage VC1b in the de-emphasis mode by the operation of the third drive state controller 82. Also, the third driver 80 blocks the third drive transistor MN3 in a non-conductive state (for example, inactive state) by the operation of the third drive state controller 82.

The fourth driver 81 includes a fourth drive transistor MN4 and a fourth drive state controller 83. The fourth drive transistor MN4 is coupled between the ground terminal VSS and the first output terminal OUTa. The fourth drive state controller 83 applies the fifth resistance setting voltage (for example resistance setting voltage VC1a) to a gate of the fourth drive transistor MN4 in the emphasis mode, with the resistance value between the source and the drain of the fourth drive transistor MN4 as the fifth resistance value RNa. Also, the fourth drive transistor MN4 applies the sixth resistance setting voltage (for example resistance setting voltage VC1b) to a gate of the fourth drive transistor MN4 in the de-emphasis mode, with the resistance value between the source and the drain of the fourth drive transistor MN4 as the sixth resistance value RNb.

In more detail, the fourth drive state controller 83 includes a PMOS transistor MPCa4, a PMOS transistor MPCb4, an NMOS transistor MNCa4, and an NMOS transistor MNCb4.

The resistance setting voltage VC1a is applied to a source of the PMOS transistor MPCa4. The source of the PMOS transistor MPCa4 is coupled to a gate of the fourth drive transistor MN4. An output control signal SLa is supplied to the gate of the PMOS transistor MPCa4. The resistance setting voltage VC1b is applied to a source of the PMOS transistor MPCb4. A drain of the PMOS transistor MPCb4 is coupled to the gate of the fourth drive transistor MN4. An output control signal SLb is supplied to a gate of the PMOS transistor MPCb4.

A drain of the NMOS transistor MNCa4 is coupled to the gate of the fourth drive transistor MN4. A source of the NMOS transistor MNCa4 is coupled to a drain of the NMOS transistor MNCb4. The output control signal SLa is supplied to a gate of the NMOS transistor MNCa4. The drain of the NMOS transistor MNCb4 is coupled to the source of the NMOS transistor MNCa4. The ground voltage VSS is applied to a source of the NMOS transistor MNCb4. The output control signal SLb is supplied to a gate of the NMOS transistor MNCb4.

That is, the fourth drive state controller 83 applies the resistance setting voltage VC1a to the gate of the fourth drive transistor MN4 in the period where the output control signal SLa is low level, and applies the resistance setting voltage VC1b to the gate of the fourth drive transistor MN4 in the period where the output control signal SLb is low level. Also, the fourth drive state controller 83 applies the ground voltage VSS to the gate of the fourth drive transistor MN4 in the period where both of the output control signal SLa and the output control signal SLb are high level.

The fourth driver 81 sets the resistance value of the fourth drive transistor MN4 as the fifth resistance value RNa according to the resistance setting voltage VC1a in the emphasis mode by the operation of the fourth drive state controller 83. The fourth driver 81 sets the resistance value of the fourth drive transistor MN4 as the sixth resistance value RNb according to the resistance setting voltage VC1b in the de-emphasis mode by the operation of the fourth drive state controller 83. Also, the fourth driver 81 blocks the fourth drive transistor MN4 in a non-conductive state (for example, inactive state) by the operation of the fourth drive state controller 83.

The first drive transistor MN1 to the fourth drive transistor MN4 are of transistors of the same conduction type, and identical in the resistance setting voltage applied in each of the emphasis mode and the de-emphasis mode, and therefore identical in the gate-source voltages Vgs with each other. That is, the first drive transistor MN1 to the fourth drive transistor MN4 have the same resistance value in the emphasis mode and the de-emphasis mode. In more detail, the third resistance value RPa and the fifth resistance value RNa have the same resistance value, and the fourth resistance value RPb and the sixth resistance value RNb have the same resistance value.

The variable resistor 34 has a bridge resistor 35 and a resistance controller 36. The bridge resistor 35 has a variable resistance transistor MNR. The variable resistance transistor MNR is coupled between the first output terminal OUTa and the second output terminal OUTb. The resistance controller 36 applies a first resistance setting voltage (for example, resistance setting voltage VC2a) to a gate of the variable resistance transistor MNR in the emphasis mode, with a resistance value between the source and the drain of the variable resistance transistor MNR as the first resistance value RMa. The resistance controller 36 applies a second resistance setting voltage (for example, resistance setting voltage VC2b) to a gate of the variable resistance transistor MNR in the de-emphasis mode, with a resistance value between the source and the drain of the variable resistance transistor MNR as the second resistance value RMb.

In more detail, the resistance controller 36 includes a PMOS transistor MPRa1, a PMOS transistor MPRb1, an NMOS transistor MNRa1, and an NMOS transistor MNRb1.

A resistance setting voltage VS1a is applied to a source of the PMOS transistor MPRa1. A source of the PMOS transistor MPRa1 is coupled to the gate of the variable resistance transistor MNR. A switch control signal RCa is supplied to a gate of the PMOS transistor MPRa1. A resistance setting voltage VS1b is applied to the source of the PMOS transistor MPRb1. A drain of a PMOS transistor MPSb1 is coupled to the gate of the variable resistance transistor MNR. The output control signal SLb is supplied to a gate of the PMOS transistor MPCb1.

A drain of the NMOS transistor MNRa1 is coupled to the gate of the variable resistance transistor MNR. A source of the NMOS transistor MNRa1 is coupled to a drain of the NMOS transistor MNRb1. The switch control signal RCa is supplied to the gate of the NMOS transistor MNRa1. The drain of the NMOS transistor MNRb1 is coupled to the source of the NMOS transistor MNRa1. The ground voltage VSS is applied to the source of the NMOS transistor MNRb1. A switch control signal RCb is supplied to the gate of the NMOS transistor MNRb1.

That is, the resistance controller 36 applies the resistance setting voltage VC2a to the gate of the variable resistance transistor MNR in the period where the switch control signal RCa is low level, and applies the resistance setting voltage VC2b to the gate of the variable resistance transistor MNR in the period where the switch control signal RCb is low level. Also, the resistance controller 36 applies the ground terminal VSS to the gate of the variable resistance transistor MNR in the period where both of the switch control signal RCa and the switch control signal RCb are high level.

The variable resistor 34 sets the resistance value of the variable resistance transistor MNR as the first resistance value RMa according to the resistance setting voltage VC1a in the emphasis mode by the operation of the resistance controller 36. The variable resistor 34 sets the resistance value of the variable resistance transistor MNR as the second resistance value RMb according to the resistance setting voltage VC1b in the de-emphasis mode by the operation of the resistance controller 36. Also, the variable resistor 34 blocks the variable resistance transistor MNR in the non-conductive state (for example, inactive state) by the operation of the resistance controller 36.

Figure 8:
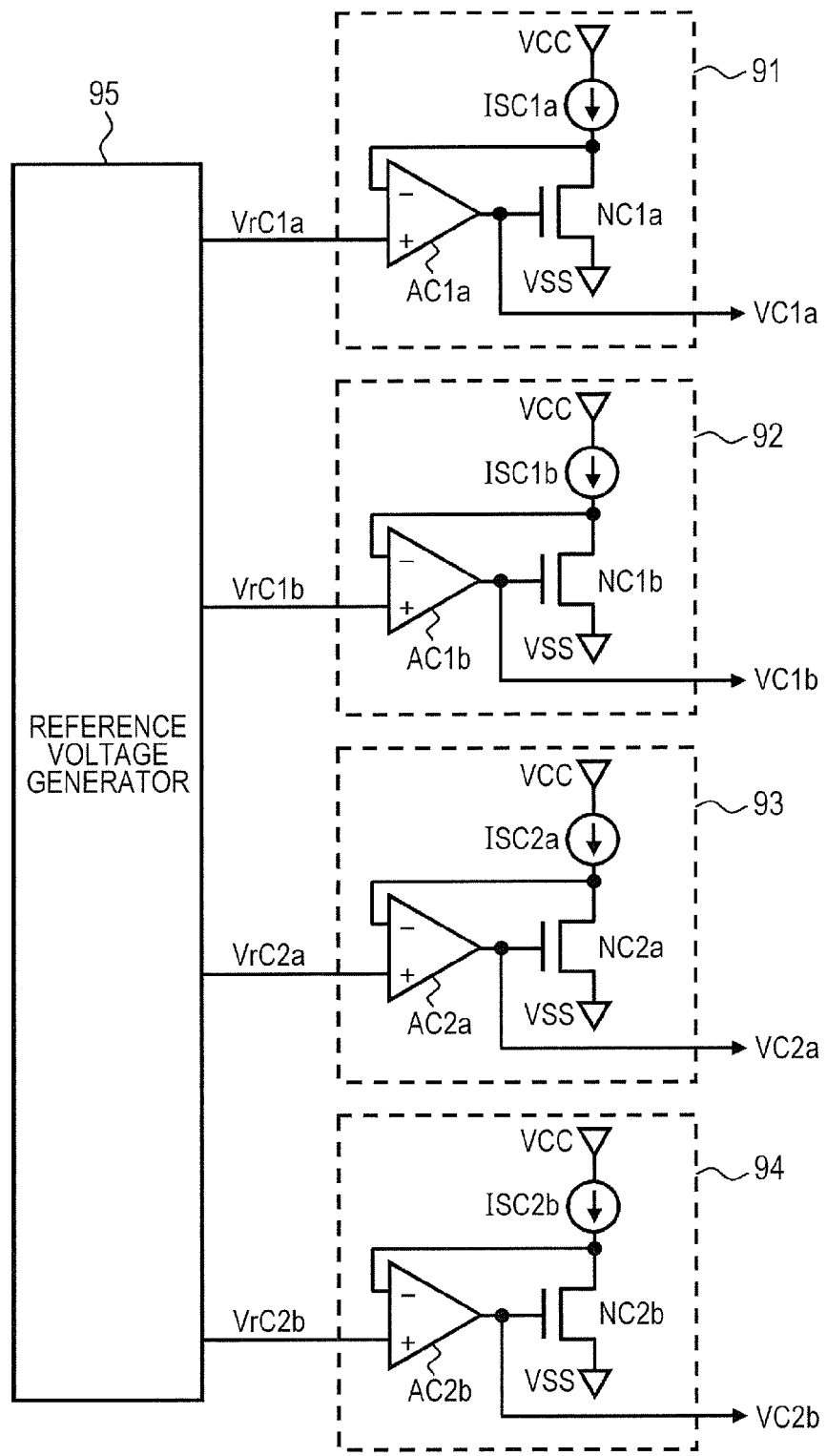
FIG. 8 is a block diagram illustrating a control voltage generator in the semiconductor device according to the third embodiment.

The semiconductor device 3 according to the third embodiment has one feature in the method of generating the resistance setting voltages VC1a, VC1b, VC2a, and VC2b. The control voltage generator 42 will be described in detail. A block diagram of the control voltage generator 42 is illustrated in FIG. 8. As illustrated in FIG. 8, the control voltage generator 42 includes resistance setting voltage generators 91 to 94, and a reference voltage generator 95. The reference voltage generator 95 generates reference voltages VrC1a, VrC1b, VrC2a, and VrC2b.

The resistance setting voltage generator 91 includes a differential amplifier AC1a, a resistance setting transistor NC1a, and a constant current source ISC1a. The differential amplifier AC1a has a non-inverting input terminal input with the reference voltage VrC1a, and an inverting input terminal coupled to a drain of the resistance setting transistor NC1a. An output terminal of the differential amplifier AC1a is coupled to a gate of the resistance setting transistor NC1a. The ground terminal VSS is applied to a source of the resistance setting transistor NC1a. The constant current source ISC1a is coupled between the supply terminal VCC and the drain of the resistance setting transistor NC1a. An output signal of the differential amplifier AC1a becomes the resistance setting voltage VC1a. The resistance setting transistor NC1a is an NMOS transistor.

The resistance setting voltage generator 92 includes a differential amplifier AC1c, a resistance setting transistor NC1b, and a constant current source ISC1b. The differential amplifier AC1b has a non-inverting input terminal input with the reference voltage VrC1b, and an inverting input terminal coupled to a drain of the resistance setting transistor NC1b. An output terminal of the differential amplifier AC1b is coupled to a gate of the resistance setting transistor NC1b. The ground terminal VSS is applied to a source of the resistance setting transistor NC1b. The constant current source ISC1b is coupled between the supply terminal VCC and the drain of the resistance setting transistor NC1b. An output signal of the differential amplifier AC1b becomes the resistance setting voltage VC1b. The resistance setting transistor NC1b is an NMOS transistor.

The resistance setting voltage generator 93 includes a differential amplifier AC2a, a resistance setting transistor NC2a, and a constant current source ISC2a. The differential amplifier AC2a has a non-inverting input terminal input with the reference voltage VrC2a, and an inverting input terminal coupled to a drain of the resistance setting transistor NC2a. An output terminal of the differential amplifier AC2a is coupled to a gate of the resistance setting transistor NC2a. The ground terminal VSS is applied to a source of the resistance setting transistor NC2a. The constant current source ISC2a is coupled between the supply terminal VCC and the drain of the resistance setting transistor NC2a. An output signal of the differential amplifier AC2a becomes the resistance setting voltage VC2a. The resistance setting transistor NC2a is an NMOS transistor.

The resistance setting voltage generator 94 includes a differential amplifier AC2b, a resistance setting transistor NC2b, and a constant current source ISC2b. The differential amplifier AC2b has a non-inverting input terminal input with the reference voltage VrC2b, and an inverting input terminal coupled to a drain of the resistance setting transistor NC2b. An output terminal of the differential amplifier AC2b is coupled to a gate of the resistance setting transistor NC2b. The ground terminal VSS is applied to a source of the resistance setting transistor NC2b. The constant current source ISC2b is coupled between the supply terminal VCC and the drain of the resistance setting transistor NC2b. An output signal of the differential amplifier AC2b becomes the resistance setting voltage VC2b. The resistance setting transistor NC2b is an NMOS transistor.

That is, the resistance setting voltage generators 91 to 94 apply a voltage corresponding to the reference voltage between the source and the drain of the current setting transistor, and sets a voltage applied to the gate of the current setting transistor as a resistance setting voltage to be output, when a current output by a constant current flows in the current setting transistor. In this example, the transistors have such a characteristic that the transistors having the same structure generally have the same on-resistance between the source and the drain if the gate-source voltages Vgs is identical. Under the circumstances, in the third embodiment, it is preferable that the current setting transistors and the drive transistors, which are applied with the same gate voltage (for example, resistance setting voltage), have a pair property.

The transistors are formed at positions close to each other over a semiconductor chip so that a high pair property (characteristic small in the relative variation of the characteristic) can be realized. That is, in the semiconductor device 3 according to the third embodiment, it is preferable that the resistance setting transistors NC1a, NC1b, and the first drive transistor MN1 to the fourth drive transistor MN4 are formed at positions closer to each other over the semiconductor chip. Also, it is preferable that the resistance setting transistors NC2a, NC2b, and the variable resistance transistor MNR are formed at positions closer to each other over the semiconductor chip.

Figure 9:
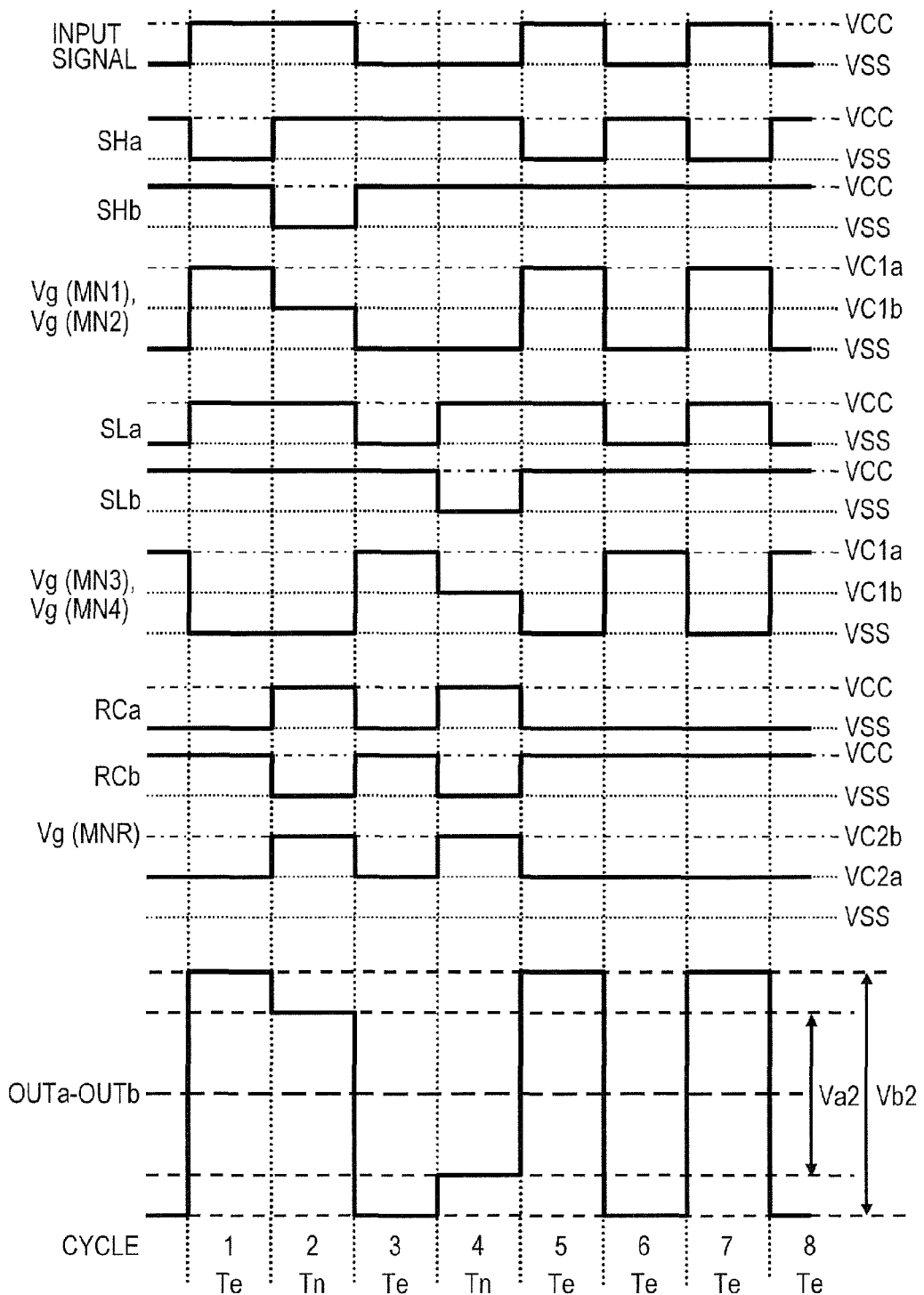
FIG. 9 is a timing chart illustrating the operation of the semiconductor device according to the third embodiment.

Subsequently, the operation of the semiconductor device 3 according to the third embodiment will be described. A timing chart illustrating the operation of the semiconductor device 3 according to the third embodiment is illustrated in FIG. 9. An example illustrated in FIG. 9 deals with the same input signal as that in the timing chart illustrating the operation of the semiconductor device 1 according to the first embodiment illustrated in FIG. 4.

As illustrated in FIG. 9, in the semiconductor device 3 according to the third embodiment, when the control in the emphasis mode is conducted in the period where the signal level of the input signal is high level (period indicated by the period Te having the input signal of high level in FIG. 9), the output control signal SHa is set to low level, and the output control signals SHb, SLa, and SLb are set to high level. As a result, the gate voltage Vg (MN1) of the first drive transistor MN1 and the gate voltage Vg (MN2) of the second drive transistor MN2 are set to the resistance setting voltage VC1a. The first drive transistor MN1 and the second drive transistor MN2 are rendered conductive in a state where the output impedance is the third resistance value RPa.

Also, in the semiconductor device 3 according to the third embodiment, when the control in the emphasis mode is conducted in the period where the signal level of the input signal is high level, the switch control signal RCa is set to low level, and the switch control signal RCb is set to high level. As a result, the gate voltage Vg (MNR) of the variable resistance transistor MNR is set to the resistance setting voltage VC2a. In the variable resistance transistor MNR, the resistance value between the source and the drain thereof is the first resistance value RMa.

On the other hand, as illustrated in FIG. 9, in the semiconductor device 3 according to the third embodiment, when the control in the emphasis mode is conducted in the period where the signal level of the input signal is low level (period indicated by the period Te having the input signal of low level in FIG. 9), the output control signal SLa is set to low level, and the output control signals SHa, SHb, and SLb are set to high level. As a result, the gate voltage Vg (MN3) of the third drive transistor MN3 and the gate voltage Vg (MN4) of the fourth drive transistor MN4 are set to the resistance setting voltage VC1a. The third drive transistor MN3 and the fourth drive transistor MN4 are rendered conductive in a state where the output impedance is the third resistance value RPa.

Also, in the semiconductor device 3 according to the third embodiment, when the control in the emphasis mode is conducted in the period where the signal level of the input signal is low level, the switch control signal RCa is set to low level, and the switch control signal RCb is set to high level. As a result, the gate voltage Vg (MNR) of the variable resistance transistor MNR becomes the resistance setting voltage VC2a. In the variable resistance transistor MNR, the resistance value between the source and the drain thereof is the first resistance value RMa.

With the above operation, in the semiconductor device 3 according to the third embodiment, the amplitude of the differential signal in the emphasis mode is set to Va2 as in the semiconductor device according to the first embodiment.

Also, as illustrated in FIG. 9, in the semiconductor device 3 according to the third embodiment, when the control in the de-emphasis mode is conducted in the period where the signal level of the input signal is high level (period indicated by the period Tn having the input signal of high level in FIG. 9), the output control signal SHb is set to low level, and the output control signals SHa, SLa, and SLb are set to high level. As a result, the gate voltage Vg (MN1) of the first drive transistor MN1 and the gate voltage Vg (MN2) of the second drive transistor MN2 are set to the resistance setting voltage VC1b. The first drive transistor MN1 and the second drive transistor MN2 are rendered conductive in a state where the output impedance is the fourth resistance value RPb.

Also, in the semiconductor device 3 according to the third embodiment, when the control in the de-emphasis mode is conducted in the period where the signal level of the input signal is high level, the switch control signal RCa is set to high level, and the switch control signal RCb is set to low level. As a result, the gate voltage Vg (MNR) of the variable resistance transistor MNR is set to the resistance setting voltage VC2b. In the variable resistance transistor MNR, the resistance value between the source and the drain thereof is the second resistance value RMb.

On the other hand, as illustrated in FIG. 9, in the semiconductor device 3 according to the third embodiment, when the control in the de-emphasis mode is conducted in the period where the signal level of the input signal is low level (period indicated by the period Tn having the input signal of low level in FIG. 9), the output control signal SLb is set to low level, and the output control signals SHa, SLb, and SLb are set to high level. As a result, the gate voltage Vg (MN3) of the third drive transistor MN3 and the gate voltage Vg (MN4) of the fourth drive transistor MN4 become the resistance setting voltage VC1b. The third drive transistor MN3 and the fourth drive transistor MN4 are rendered conductive in a state where the output impedance is the fourth resistance value RPb.

Also, in the semiconductor device 3 according to the third embodiment, when the control in the de-emphasis mode is conducted in the period where the signal level of the input signal is low level, the switch control signal RCa is set to high level, and the switch control signal RCb is set to low level. As a result, the gate voltage Vg (MNR) of the variable resistance transistor MNR becomes the resistance setting voltage VC2b. In the variable resistance transistor MNR, the resistance value between the source and the drain thereof is the second resistance value RMb.

With the above operation, in the semiconductor device 3 according to the third embodiment, the amplitude of the differential signal in the de-emphasis mode is set to Vb2 as in the semiconductor device according to the first embodiment.

As described above, in the third embodiment, the drive capability of the drive transistor is controlled according to the resistance setting voltage to be applied to the gates of the first drive transistor MN1 to the fourth drive transistor MN4. For that reason, the number of transistors larger in the transistor size having the high drive capability in the drivers, and the number of resistive elements can be reduced more than those in the first and second embodiments. In the drivers of the semiconductor device 3 according to the third embodiment, two PMOS transistors and two NMOS transistors are provided in addition to the drive transistors. However, those transistors are smaller in the size than the drive transistors, and an influence of those transistors on the circuit area is small.

Also, in the semiconductor device 3 according to the third embodiment, because the number of circuit elements coupled to the output terminals can be reduced, parasitic capacitances and parasitic resistances of the transistors caused by the generation of the differential signals can be reduced. For that reason, the semiconductor device 3 according to the third embodiment can deal with higher-speed signals.

Also, the resistance setting voltages VC1a, VC1b, VC2a, and VC2b can be relatively easily generated on the basis of the reference voltage, and further varied. For that reason, as compared with a case in which the output impedances of the drivers and the resistance value of the variable resistor are set by processing such as trimming with high precision, the output impedances of the drivers and the resistance value of the variable resistor can be set with higher precision while reducing the number of circuit elements.

Further, in the semiconductor device 3 according to the third embodiment, the number of control signals for controlling the drivers and the variable resistor can be reduced as compared with the first and second embodiments. For that reason, the semiconductor device 3 according to the third embodiment can deal with the higher-speed signals.

Fourth Embodiment

Figure 10:
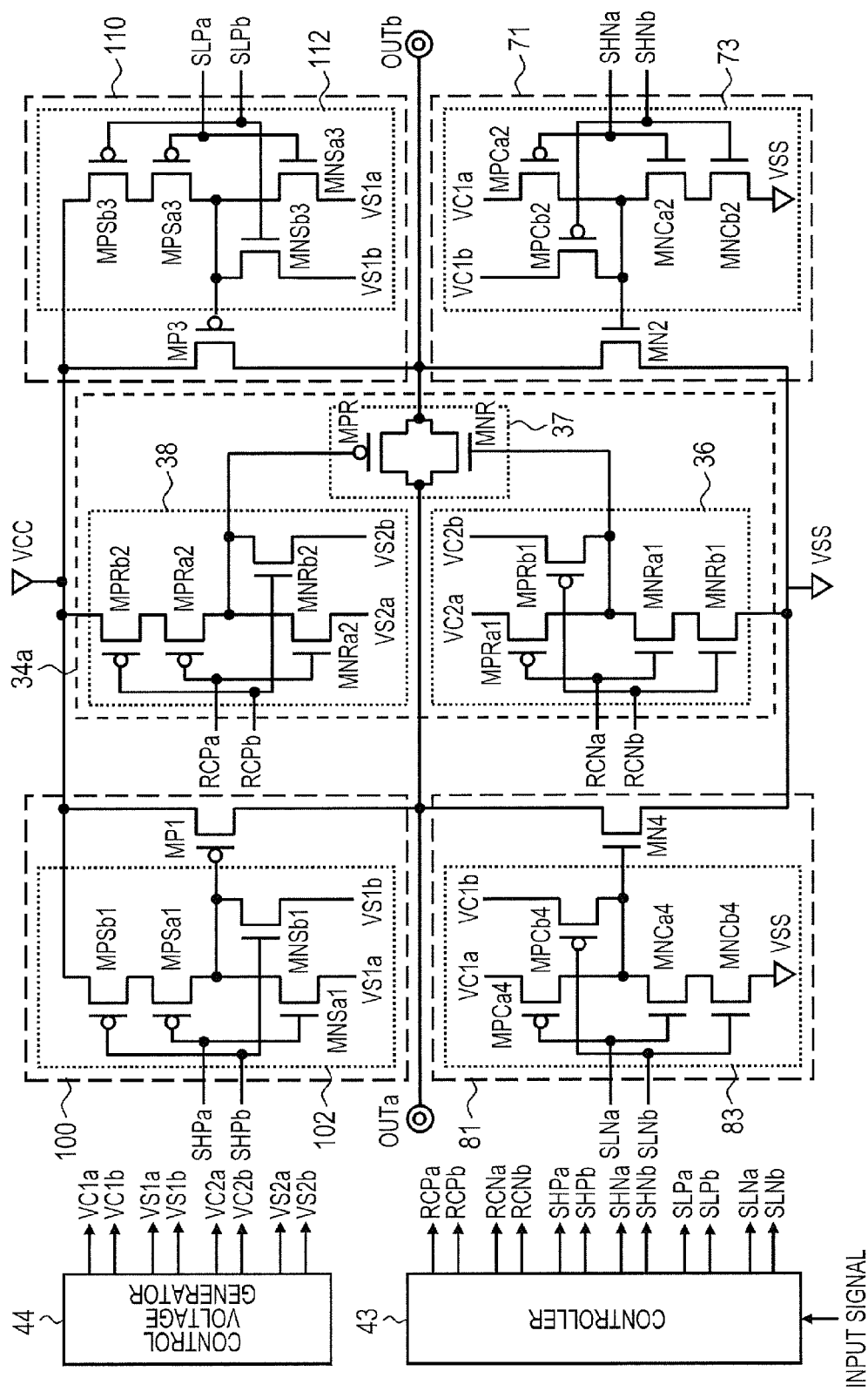
FIG. 10 is a block diagram illustrating a semiconductor device according to a fourth embodiment.

A block diagram of a semiconductor device 4 according to a fourth embodiment is illustrated in FIG. 10. As illustrated in FIG. 10, in the semiconductor device 4 according to the fourth embodiment, the first driver 70 and the third driver 80 in the semiconductor device 3 according to the third embodiment are replaced with a first driver 100 and a third driver 110. Also, in the semiconductor device 4 according to the fourth embodiment, the variable resistor 34 is replaced with a variable resistor 34a. The variable resistor 34a uses a transfer gate configured by the variable resistance transistor MNR and a variable resistance transistor MPR as a bridge resistor 37. For that reason, the variable resistor 34a includes a resistance controller 38 that controls a resistance value of the variable resistance transistor MPR in addition to the resistance controller 36.

A controller 43 generates various control signals that control the output impedances of the drivers and the resistance value of the variable resistor. The output control signals SHNa, SHNb, SLNa, SLNb and switch control signals RCNa, RCNb among the control signals output by the controller 43 are the same as the output control signals SHa, SHb, SLa, SLb, and the switch control signals RCa, RCb. On the other hand, the output control signals SHPa, SHPb, SLPa, SLPb, and switch control signals RCPa, RCPb among the control signals output by the controller 43 are signals resulting from changing the logic levels of the output control signals SHa, SHb, SLa, SLb, and the switch control signals RCa, RCb which are output by the controller 41 in the third embodiment for controlling the PMOS transistors.

Also, a control voltage generator 44 generates resistance setting voltages VS1a, VS1b, VS2a, and VS2b in addition to the resistance setting voltages VC1a, VC1b, VC2a, VC2b output by the control voltage generator 42.

The first driver 100 includes a first drive state controller 102, and a first drive transistor MP1. The first drive transistor MP1 is coupled between the supply terminal VCC and the first output terminal OUTa. The first drive state controller 102 applies a third resistance setting voltage (for example, resistance setting voltage VS1a) to the gate of the first drive transistor MP1 in the emphasis mode, with the resistance value between the source and the drain of a first drive transistor MMP1 as the third resistance value RPa. The first drive state controller 102 applies a fourth resistance setting voltage (for example, resistance setting voltage VS1b) to the gate of the first drive transistor MP1 in the de-emphasis mode, with the resistance value between the source and the drain of the first drive transistor MP1 as the fourth resistance value RPb.

In more detail, the first drive state controller 102 includes a PMOS transistor MPSa1, the PMOS transistor MPSb1, an NMOS transistor MNSa1, and an NMOS transistor MNSb1.

A source of the PMOS transistor MPSa1 is coupled to the supply terminal VCC. A drain of the PMOS transistor MPSa1 is coupled to a source of the PMOS transistor MPSb1. A drain of the PMOS transistor MPSb1 is coupled to the gate of the first drive transistor MP1. A drain of the NMOS transistor MNSa1 is coupled to the gate of the first drive transistor MP1. The resistance setting voltage VS1$a$ is applied to a source of the NMOS transistor MNSa1. A drain of the NMOS transistor MNSb1 is coupled to the gate of the first drive transistor MP1. The resistance setting voltage VS1$b$ is applied to a source of the NMOS transistor MNSb1. The output control signal SHPa is supplied to a gate of the PMOS transistor MPSb1 and a gate of the NMOS transistor MNSa1. The output control signal SHPb is supplied to a gate of the PMOS transistor MPSb1 and a gate of the NMOS transistor MNSb1.

That is, the first drive state controller 102 applies the resistance setting voltage VS1$a$ to the gate of the first drive transistor MP1 in the period where the output control signal SHPa is high level. The first drive state controller 102 applies the resistance setting voltage VS1$b$ to the gate of the first drive transistor MP1 in the period where the output control signal SHPb is high level. Also, the first drive state controller 102 applies the supply terminal VCC to the gate of the first drive transistor MP1 in the period where both of the output control signal SHPa and the output control signal SHPb are low level. The output control signals SHPa and SHPb are so controlled as not to be high level at the same time.

The first driver 100 sets the resistance value of the first drive transistor MP1 as the third resistance value RPa according to the resistance setting voltage VS1$a$ in the emphasis mode by the operation of the first drive state controller 102. The first driver 100 sets the resistance value of the first drive transistor MP1 as the fourth resistance value RPb according to the resistance setting voltage VS1$b$ in the de-emphasis mode by the operation of the first drive state controller 102. Also, the first driver 100 blocks the first drive transistor MP1 in a non-conductive state (for example, inactive state) by the operation of the first drive state controller 102.

The third driver 110 includes a third drive state controller 112 and a third drive transistor MP3. The third drive transistor MP3 is coupled between the supply terminal VCC and the second output terminal OUTb. The third drive state controller 112 applies a fifth resistance setting voltage (for example, resistance setting voltage VS1$a$) to the gate of the third drive transistor MP3 in the emphasis mode, with the resistance value between the source and the drain of the third drive transistor MMP3 as the third resistance value RPa. The third drive state controller 112 applies a sixth resistance setting voltage (for example, resistance setting voltage VS1$b$) to the gate of the third drive transistor MP3 in the de-emphasis mode, with the resistance value between the source and the drain of the third drive transistor MP3 as the fourth resistance value RPb. The fifth resistance setting voltage and the sixth resistance setting voltage have voltage values different from the third resistance setting voltage and the fourth resistance setting voltage, but the third resistance setting voltage and fourth resistance setting voltage are equal to each other.

In more detail, the third drive state controller 112 includes a PMOS transistor MPSa3, a PMOS transistor MPSb3, an NMOS transistor MNSa3, and an NMOS transistor MNSb3.

A source of the PMOS transistor MPSa3 is coupled to the supply terminal VCC. A drain of the PMOS transistor MPSa3 is coupled to a source of the PMOS transistor MPSb3. A drain of the PMOS transistor MPSb3 is coupled to the gate of the third drive transistor MP3. A drain of the NMOS transistor MNSa3 is coupled to the gate of the third drive transistor MP3. The resistance setting voltage VS1$a$ is applied to a source of the NMOS transistor MNSa3. A drain of the NMOS transistor MNSb3 is coupled to the gate of the third drive transistor MP3. The resistance setting voltage VS1$b$ is applied to a source of the NMOS transistor MNSb3. The output control signal SLPa is supplied to a gate of the PMOS transistor MPSb3 and a gate of the NMOS transistor MNSa3. The output control signal SLPb is supplied to a gate of the PMOS transistor MPSb3 and a gate of the NMOS transistor MNSb3.

That is, the third drive state controller 112 applies the resistance setting voltage VS1$a$ to the gate of the third drive transistor MP3 in the period where the output control signal SLPa is high level. The third drive state controller 112 applies the resistance setting voltage VS1$b$ to the gate of the third drive transistor MP3 in the period where the output control signal SLPb is high level. Also, the third drive state controller 112 applies the supply terminal VCC to the gate of the third drive transistor MP3 in the period where both of the output control signal SLPa and the output control signal SLPb are low level. The output control signals SLPa and SLPb are so controlled as not to be high level at the same time.

The third driver 110 sets the resistance value of the third drive transistor MP3 as the third resistance value RPa according to the resistance setting voltage VS1$a$ in the emphasis mode by the operation of the third drive state controller 112. The third driver 110 sets the resistance value of the third drive transistor MP3 as the fourth resistance value RPb according to the resistance setting voltage VS1$b$ in the de-emphasis mode by the operation of the third drive state controller 112. Also, the third driver 110 blocks the third drive transistor MP3 in a non-conductive state (for example, inactive state) by the operation of the third drive state controller 112.

In the semiconductor device 3 according to the third embodiment, PMOS transistors are used for the first drive transistor MP1 and the third drive transistor MP3, and NMOS transistors are used for the second drive transistor MN2 and the fourth drive transistor MN4. For that reason, in order that a relationship between the third resistance value and the fourth resistance value satisfies RPa>RPb, there is a need to allow a relationship of the resistance control voltages to satisfy VS1$a$<VS1$b$. Also, in order that a relationship between the fifth resistance value and the sixth resistance value satisfies RNa>RNb, there is a need to allow a relationship of the resistance control voltages to satisfy VC1$a$>VC1$b$. Subsequently, a configuration of the variable resistor 34$a$ will be described. The variable resistor 34$a$ includes the bridge resistor 37 and the resistance controllers 36, 38. The resistance controller 36 is identical with the resistance controller 36 in the semiconductor device 3 according to the third embodiment, and therefore a description thereof will be omitted.

The bridge resistor 37 includes the variable resistance transistors MNR and MPR. The variable resistance transistors MNR and MPR are coupled in parallel between the first output terminal OUTa and the second output terminal OUTb. That is, the variable resistor 34$a$ realizes the first resistance value RMa and the second resistance value RMb by a parallel resistor of the variable resistance transistor MNR and the variable resistance transistor MPR. In the emphasis mode, the resistance controller 36 applies the first resistance setting voltage (for example, resistance setting voltage VC2$a$) to the gate of the variable resistance transistor MNR, and the resistance controller 38 applies the seventh resistance setting voltage (for example, resistance setting voltage VS2$a$) to the gate of the variable resistance transistor MPR. A parallel resistance of the variable resistance transistor MNR applied with the resistance setting voltage VC2a and the variable resistance transistor MPR applied with the resistance setting voltage VS2a is the first resistance value RMa.

Also, In the de-emphasis mode, the resistance controller 36 applies the second resistance setting voltage (for example, resistance setting voltage VC2b) to the gate of the variable resistance transistor MNR, and the resistance controller 38 applies the eighth resistance setting voltage (for example, resistance setting voltage VS2b) to the gate of the variable resistance transistor MPR. A parallel resistance of the variable resistance transistor MNR applied with the resistance setting voltage VC2b and the variable resistance transistor MPR applied with the resistance setting voltage VS2b is the second resistance value RMb.

The resistance controller 38 includes a PMOS transistor MPRa2, a PMOS transistor MPRb2, an NMOS transistor MNRa2, and an NMOS transistor MNRb2.

A source of the PMOS transistor MPRa2 is coupled to the supply terminal VCC. A drain of the PMOS transistor MPRa2 is coupled to a source of the PMOS transistor MPRb2. A drain of the PMOS transistor MPRb2 is coupled to the gate of the variable resistance transistor MPR. A drain of the NMOS transistor MNRa2 is coupled to the gate of the variable resistance transistor MPR. The resistance setting voltage VS2a is applied to a source of the NMOS transistor MNRa2. A drain of the NMOS transistor MNRb2 is coupled to the gate of the variable resistance transistor MPR. The resistance setting voltage VS2b is applied to a source of the NMOS transistor MNRb2. An output control signal RCPa is supplied to the gate of the PMOS transistor MPRa2 and the gate of the NMOS transistor MNRa2. An output control signal RCPb is supplied to the gate of the PMOS transistor MPRb2 and the gate of the NMOS transistor MNRb2.

That is, the resistance controller 38 applies the resistance setting voltage VS2a to the gate of the variable resistance transistor MPR in the period where the switch control signal RCPa is high level. The resistance controller 38 applies the resistance setting voltage VS2b to the gate of the variable resistance transistor MPR in the period where the switch control signal RCPb is high level. Also, the resistance controller 38 applies the supply terminal VCC to the gate of the variable resistance transistor MPR in the period where both of the switch control signal RCPa and the switch control signal RCPb are low level.

Figure 11:
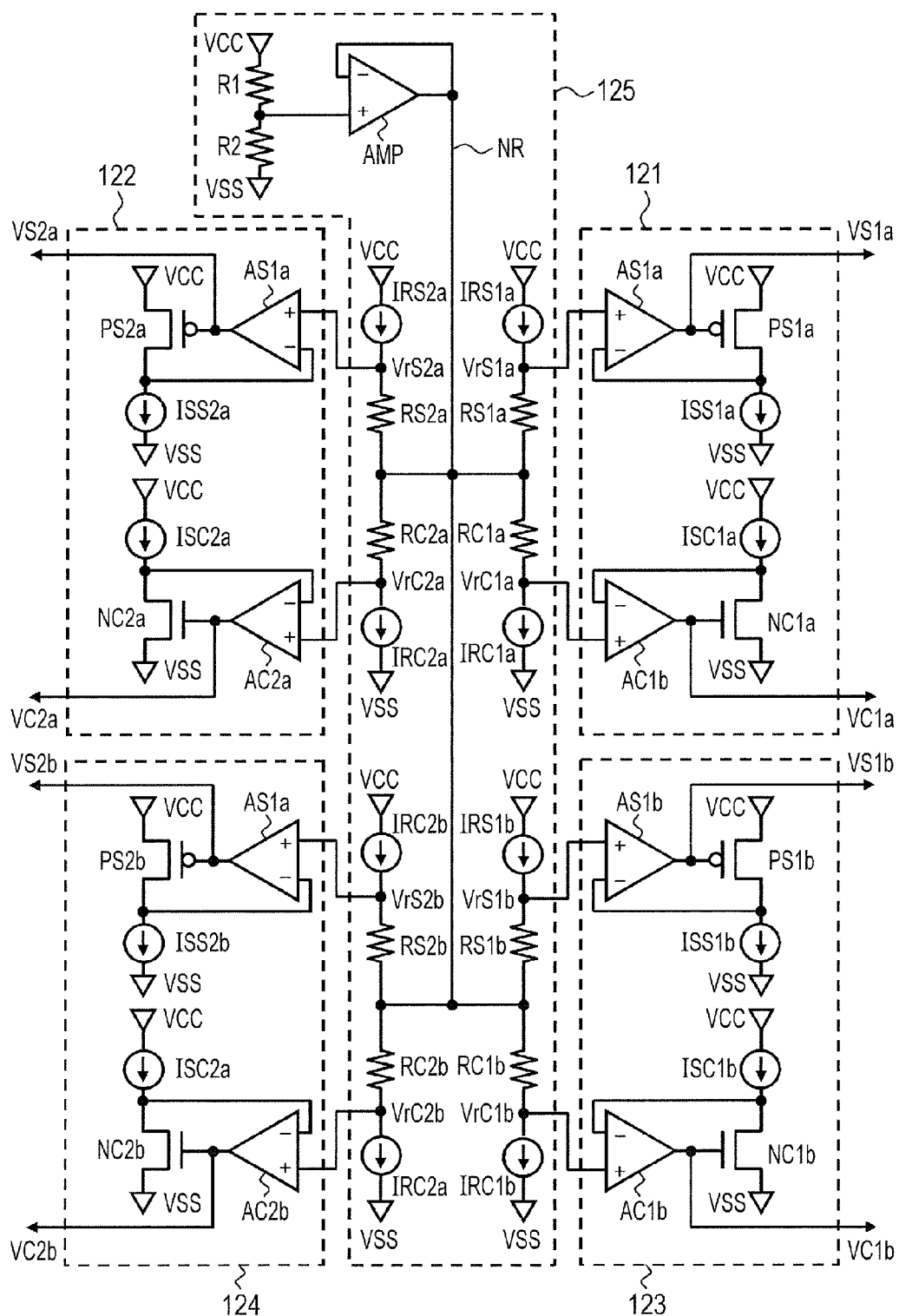
FIG. 11 is a block diagram illustrating a control voltage generator in the semiconductor device according to the fourth embodiment.

The semiconductor device 4 according to the fourth embodiment has one feature in the method of generating the resistance setting voltages VC1a, VC1b, VC2a, VC2b, VS1a, VS1b, VS2a, and VS2b. The control voltage generator 44 will be described in detail. A block diagram of the control voltage generator 44 is illustrated in FIG. 11. As illustrated in FIG. 11, the control voltage generator 44 includes the resistance setting voltage generators 121 to 124, and a reference voltage generator 125. The reference voltage generator 125 generates the reference voltages VrC1a, VrC1b, VrC2a, VrC2b, VrS1a, VrS1b, VrS2a, and VrS2b.

The reference voltage generator 125 includes resistors R1, R2, and a differential amplifier AMP. The resistors R1 and R2 are coupled in series between the supply terminal VCC and the ground terminal VSS. The reference voltage resulting from dividing the supply terminal VCC by the resistance values of the resistors R1 and R2 is generated at a node of the resistors R1 and R2. A differential amplifier AMP2 has a non-inverting input terminal to which the reference voltage is input, and an inverting input terminal coupled to an output terminal of the differential amplifier AMP. That is, the differential amplifier AMP functions as a buffer, and outputs the reference voltage. Hereinafter the output terminal of the differential amplifier is called "reference voltage node NR".

Also, the reference voltage generator 125 includes current sources IRS1a, IRC1a, and resistors RS1a, RC1a. The current source IRS1a is coupled between the resistor RS1a and the supply terminal VCC. The resistor RS1a is coupled between the current source IRS1a and a reference voltage node NR. The reference voltage generator 125 generates the reference voltage VrS1a at the node between the current source IRS1a and the resistor RS1a. That is, the reference voltage VrS1a is determined according to the reference voltage and a voltage determined by a product of the resistance value of the resistor RS1a and an output current of the current source IRS1a. The current source IRC1a is coupled between the resistor RC1a and the ground terminal VSS. The resistor RC1a is coupled between the current source IRC1a and the reference voltage node NR. The reference voltage generator 125 generates the reference voltage VrC1a at a node of the current source IRC1a and the resistor RC1a. That is, the reference voltage VrC1a is determined according to the reference voltage, and the voltage determined by the product of the resistance value of the resistor RC1a and the output current of the current source IRC1a.

Also, the reference voltage generator 125 includes current sources IRS1b, IRC1b, and resistors RS1b, RC1b. The current source IRS1b is coupled between the resistor RS1b and the supply terminal VCC. The resistor RS1b is coupled between the current source IRS1b and the reference voltage node NR. The reference voltage generator 125 generates the reference voltage VrS1b at the node between the current source IRS1b and the resistor RS1b. That is, the reference voltage VrS1b is determined according to the reference voltage and a voltage determined by a product of the resistance value of the resistor RS1b and an output current of the current source IRS1b. The current source IRC1b is coupled between the resistor RC1b and the ground terminal VSS. The resistor RC1b is coupled between the current source IRC1b and the reference voltage node NR. The reference voltage generator 125 generates the reference voltage VrC1b at a node of the current source IRC1b and the resistor RC1b. That is, the reference voltage VrC1b is determined according to the reference voltage, and the voltage determined by the product of the resistance value of the resistor RC1b and the output current of the current source IRC1b.

Also, the reference voltage generator 125 includes current sources IRS2a, IRC2a, and resistors RS2a, RC2a. The current source IRS2a is coupled between the resistor RS2a and the supply terminal VCC. The resistor RS2a is coupled between the current source IRS2a and the reference voltage node NR. The reference voltage generator 125 generates the reference voltage VrS2a at the node between the current source IRS2a and the resistor RS2a. That is, the reference voltage VrS2a is determined according to the reference voltage and a voltage determined by a product of the resistance value of the resistor RS2a and an output current of the current source IRS2a. The current source IRC2a is coupled between the resistor RC2a and the ground terminal VSS. The resistor RC2a is coupled between the current source IRC2a and the reference voltage node NR. The reference voltage generator 125 generates the reference voltage VrC2a at a node of the current source IRC2a and the resistor RC2a. That is, the reference voltage VrC2a is determined according to the reference voltage, and the voltage determined by the product of the resistance value of the resistor RC2a and the output current of the current source IRC2a.

Also, the reference voltage generator 125 includes current sources IRS2b, IRC2b, and resistors RS2b, RC2b. The current source IRS2b is coupled between the resistor RS2b and the supply terminal VCC. The resistor RS2b is coupled between the current source IRS2b and the reference voltage node NR. The reference voltage generator 125 generates the reference voltage VrS2b at the node between the current source IRS2b and the resistor RS2b. That is, the reference voltage VrS2b is determined according to the reference voltage and a voltage determined by a product of the resistance value of the resistor RS2b and an output current of the current source IRS2b. The current source IRC2b is coupled between the resistor RC2b and the ground terminal VSS. The resistor RC2b is coupled between the current source IRC2b and the reference voltage node NR. The reference voltage generator 125 generates the reference voltage VrC2b at a node of the current source IRC2b and the resistor RC2b. That is, the reference voltage VrC2b is determined according to the reference voltage, and the voltage determined by the product of the resistance value of the resistor RC2b and the output current of the current source IRC2b.

The resistance setting voltage generator 121 is designed to add a differential amplifier AS1a, a resistance setting transistor PS1a, and a constant current source ISS1a to the differential amplifier AC1a, the resistance setting transistor NC1a, and the constant current source ISC1a in the resistance setting voltage generator 91. The differential amplifier AS1a has a non-inverting input terminal to which the reference voltage VrS1a is input, and an inverting input terminal coupled to a drain of the resistance setting transistor PS1a. An output terminal of the differential amplifier AS1a is coupled to a gate of the resistor RS1a. The supply terminal VCC is applied to a source of the resistance setting transistor PS1a. The constant current source ISS1a is coupled between the ground terminal VSS and the drain of the resistance setting transistor PS1a. An output signal of the differential amplifier AS1a becomes the resistance setting voltage VS1a. The resistance setting transistor PS1a is a PMOS transistor.

The resistance setting voltage generator 122 is designed to add a differential amplifier AS1b, a resistance setting transistor PS1b, and a constant current source ISS1b to the differential amplifier AC1b, the resistance setting transistor NC1b, and the constant current source ISC1b in the resistance setting voltage generator 92. The differential amplifier AS1b has a non-inverting input terminal to which the reference voltage VrS1b is input, and an inverting input terminal coupled to a drain of the resistance setting transistor PS1b. An output terminal of the differential amplifier AS1b is coupled to a gate of the resistor RS1b. The supply terminal VSS is applied to a source of the resistance setting transistor PS1b. The constant current source ISS1b is coupled between the ground terminal VSS and the drain of the resistance setting transistor PS1b. An output signal of the differential amplifier AS1b becomes the resistance setting voltage VS1b. The resistance setting transistor PS1b is a PMOS transistor.

The resistance setting voltage generator 123 is designed to add a differential amplifier AS2a, a resistance setting transistor PS2a, and a constant current source ISS2a to the differential amplifier AC2a, the resistance setting transistor NC2a, and the constant current source ISC2a in the resistance setting voltage generator 93. The differential amplifier AS2a has a non-inverting input terminal to which the reference voltage VrS2a is input, and an inverting input terminal coupled to a drain of the resistance setting transistor PS2a. An output terminal of the differential amplifier AS2a is coupled to a gate of the resistor RS2a. The supply terminal VCC is applied to a source of the resistance setting transistor PS2a. The constant current source ISS2a is coupled between the ground terminal VSS and the drain of the resistance setting transistor PS2a. An output signal of the differential amplifier AS2a becomes the resistance setting voltage VS2a. The resistance setting transistor PS2a is a PMOS transistor.

The resistance setting voltage generator 124 is designed to add a differential amplifier AS2b, a resistance setting transistor PS2b, and a constant current source ISS2b to the differential amplifier AC2b, the resistance setting transistor NC2b, and the constant current source ISC2b in the resistance setting voltage generator 94. The differential amplifier AS2b has a non-inverting input terminal to which the reference voltage VrS2b is input, and an inverting input terminal coupled to a drain of the resistance setting transistor PS2b. An output terminal of the differential amplifier AS2b is coupled to a gate of the resistor RS2b. The supply terminal VSS is applied to a source of the resistance setting transistor PS2b. The constant current source ISS2b is coupled between the ground terminal VSS and the drain of the resistance setting transistor PS2b. An output signal of the differential amplifier AS2b becomes the resistance setting voltage VS2b. The resistance setting transistor PS2b is a PMOS transistor.

That is, each of the resistance setting voltage generators 121 to 124 sets, as the resistance setting voltage to be output, a voltage applied to the gate of the current setting transistor when applying a voltage corresponding to the reference voltage between the source and the drain of the current setting transistor, and then allowing a current output by the constant current to flow in the current setting transistor. In this example, the transistors have such a characteristic that the transistors having the same structure generally have the same on-resistance Vgs between the source and the drain if the gate-source voltages Vgs is identical. Under the circumstances, in the fourth embodiment, it is preferable that the current setting transistors and the drive transistors, which are applied with the same gate voltage (for example, resistance setting voltage), have a pair property.

Figure 12:
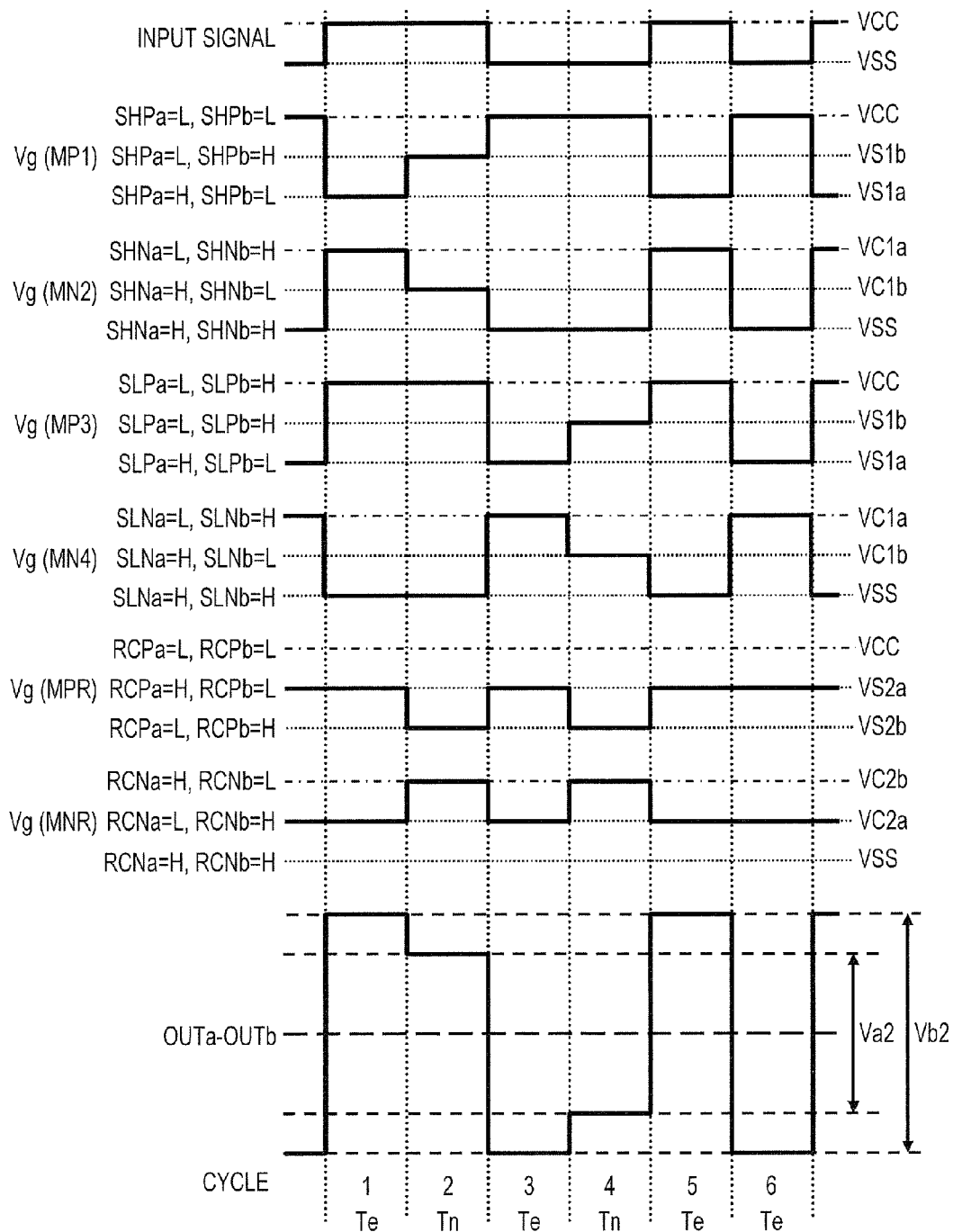
FIG. 12 is a timing chart illustrating the operation of the semiconductor device according to the fourth embodiment.

Subsequently, the operation of the semiconductor device 4 according to the fourth embodiment will be described. A timing chart illustrating the operation of the semiconductor device 4 according to the fourth embodiment is illustrated in FIG. 12. An example illustrated in FIG. 12 deals with the same input signal as that in the timing chart illustrating the operation of the semiconductor device 1 according to the first embodiment illustrated in FIG. 4.

As illustrated in FIG. 12, in the semiconductor device 4 according to the fourth embodiment, when the control in the emphasis mode is conducted in the period where the signal level of the input signal is high level (period indicated by the period Te having the input signal of high level in FIG. 12), the output control signals SHPa and SHNb are set to high level, the output control signals SHNa and SHPb are set to low level, the output control signal SLPa and SLPb are set to low level, and the output control signals SLNa and SLNb are set to high level. As a result, the gate voltage Vg (MP1) of the gate voltage Vg (MN1) of the first drive transistor MP1 becomes the resistance setting voltage VS1a, and the gate voltage Vg (MN2) of the second drive transistor MN2 becomes the resistance setting voltage VC1a. Then, the first drive transistor MP1 and the second drive transistor MN2 are rendered conductive in a state where the output impedance of the first drive transistor MP1 becomes the third resistance value RPa, and the output impedance of the second drive transistor MN2 becomes the fifth resistance value RNa.

Also, in the semiconductor device 4 according to the fourth embodiment, when the control in the emphasis mode is conducted in the period where the signal level of the input signal is high level, the switch control signals RCNa and RCPb are set to low level, and the switch control signals RCNb and RCPa are set to high level. As a result, the gate voltage Vg (MNR) of the variable resistance transistor MNR becomes the resistance setting voltage VC2a, and the gate voltage Vg (MPR) of the variable resistance transistor MPR becomes the resistance setting voltage VS2a. In the bridge resistor 37, the resistance value between the source and the drain becomes the first resistance value RMa.

On the other hand, as illustrated in FIG. 12, in the semiconductor device 4 according to the fourth embodiment, when the control in the emphasis mode is conducted in the period where the signal level of the input signal is low level (period indicated by the period Te having the input signal of low level in FIG. 12), the output control signals SLPa and SLNb are set to high level, the output control signals SLNa and SLPb are set to low level, the output control signal SHPa and SHPb are set to low level, and the output control signals SHNa and SHNb are set to high level. As a result, the gate voltage Vg (MP3) of the third drive transistor MP3 becomes the resistance setting voltage VS1a, and the gate voltage Vg (MN4) of the fourth drive transistor MN4 becomes the resistance setting voltage VC1a. Then, the third drive transistor MP3 and the fourth drive transistor MN4 are rendered conductive in a state where the output impedance of the third drive transistor MP3 becomes the third resistance value RPa, and the output impedance of the fourth drive transistor MN4 becomes the fourth resistance value RNa.

Also, in the semiconductor device 4 according to the fourth embodiment, when the control in the emphasis mode is conducted in the period where the signal level of the input signal is low level, the switch control signals RCNa and RCPb are set to low level, and the switch control signals RCNb and RCPa are set to high level. As a result, the gate voltage Vg (MNR) of the variable resistance transistor MNR becomes the resistance setting voltage VC2a, and the gate voltage Vg (MPR) of the variable resistance transistor MPR becomes the resistance setting voltage VS2a. In the bridge resistor 37, the resistance value between the source and the drain becomes the first resistance value RMa.

With the above operation, in the semiconductor device 4 according to the fourth embodiment, the amplitude of the differential signal in the emphasis mode is set to Va2 as in the semiconductor device according to the first embodiment.

Also, as illustrated in FIG. 12, in the semiconductor device 4 according to the fourth embodiment, when the control in the de-emphasis mode is conducted in the period where the signal level of the input signal is high level (period indicated by the period Tn having the input signal of high level in FIG. 12), the output control signals SHPb and SHNa are set to high level, the output control signals SHNb and SHPa are set to low level, the output control signal SLPa and SLPb are set to low level, and the output control signals SLNa and SLNb are set to high level. As a result, the gate voltage Vg (MP1) of the gate voltage Vg (MN1) of the first drive transistor MP1 becomes the resistance setting voltage VS1b, and the gate voltage Vg (MN2) of the second drive transistor MN2 becomes the resistance setting voltage VC1b. Then, the first drive transistor MP1 and the second drive transistor MN2 are rendered conductive in a state where the output impedance of the first drive transistor MP1 becomes the fourth resistance value RPb, and the output impedance of the second drive transistor MN2 becomes the sixth resistance value RNb.

Also, in the semiconductor device 4 according to the fourth embodiment, when the control in the de-emphasis mode is conducted in the period where the signal level of the input signal is high level, the switch control signals RCNb and RCPa are set to low level, and the switch control signals RCNa and RCPb are set to high level. As a result, the gate voltage Vg (MNR) of the variable resistance transistor MNR becomes the resistance setting voltage VC2b, and the gate voltage Vg (MPR) of the variable resistance transistor MPR becomes the resistance setting voltage VC2b. In the bridge resistor 37, the resistance value between the source and the drain becomes the second resistance value RMb.

On the other hand, as illustrated in FIG. 12, in the semiconductor device 4 according to the fourth embodiment, when the control in the de-emphasis mode is conducted in the period where the signal level of the input signal is low level (period indicated by the period Tn having the input signal of low level in FIG. 12), the output control signals SLPb and SLNa are set to high level, the output control signals SLNb and SLPa are set to low level, the output control signal SHPa and SHPb are set to low level, and the output control signals SHNa and SHNb are set to high level. As a result, the gate voltage Vg (MP3) of the third drive transistor MP3 becomes the resistance setting voltage VS1b, and the gate voltage Vg (MN4) of the fourth drive transistor MN4 becomes the resistance setting voltage VC1b. Then, the third drive transistor MP3 and the fourth drive transistor MN4 are rendered conductive in a state where the output impedance of the third drive transistor MP3 becomes the fourth resistance value RPb, and the output impedance of the fourth drive transistor MN4 becomes the sixth resistance value RNb.

Also, in the semiconductor device 4 according to the fourth embodiment, when the control in the de-emphasis mode is conducted in the period where the signal level of the input signal is low level, the switch control signals RCNb and RCPa are set to low level, and the switch control signals RCNa and RCPb are set to high level. As a result, the gate voltage Vg (MNR) of the variable resistance transistor MNR becomes the resistance setting voltage VS2b, and the gate voltage Vg (MPR) of the variable resistance transistor MPR becomes the resistance setting voltage VC2b. In the bridge resistor 37, the resistance value between the source and the drain becomes the second resistance value RMb.

With the above operation, in the semiconductor device 4 according to the fourth embodiment, the amplitude of the differential signal in the emphasis mode is set to Vb2 as in the semiconductor device according to the first embodiment.

As described above, in the fourth embodiment, as in the third embodiment, the drive capability of the drive transistors is controlled according to the resistance setting voltage to be applied to the gates of the first drive transistor MN1 to the fourth drive transistor MN4. For that reason, as in the third embodiment, the semiconductor device 4 according to the fourth embodiment can be reduced in the circuit area than that in the first and second embodiments. Also, the semiconductor device 4 according to the fourth embodiment can deal with the high-speed signal as in the third embodiment, because the number of circuit elements coupled to the output terminals can be reduced. Further, the semiconductor device 4 according to the fourth embodiment can set the output impedances of the drivers and the resistance value of the variable resistor with higher precision while reducing the number of circuit elements as in the third embodiment, because the resistance values of the drive transistors are controlled by the voltage.

In the semiconductor device 4 according to the fourth embodiment, as in the third embodiment, the regulator circuit 33 cannot be inserted thereinto. However, in the semiconductor device 4, an amplitude center voltage VCM of the differential signal is set to ½ of the supply voltage so as to keep the constant amplitude.

The present invention is not limited to or by the above embodiments, but can be appropriately changed without departing from the subject matter of the invention.

What is claimed is:

1. A semiconductor device comprising:
first and second output terminals that are coupled with a load resistor, and output a differential signal;
a variable resistor that is disposed between the first output terminal and the second output terminal, and has a resistance value thereof as a first resistance value in an emphasis mode, and as a second resistance value smaller than the first resistance value in a de-emphasis mode;
a first driver that is disposed between a first supply terminal and the first output terminal, and has an output impedance thereof as a third resistance value in the emphasis mode, and as a fourth resistance value larger than the third resistance value in the de-emphasis mode;
a second driver that is disposed between a second supply terminal and the second output terminal, and has an output impedance thereof as a fifth resistance value in the emphasis mode, and as a sixth resistance value larger than the fifth resistance value in the de-emphasis mode; and
a controller that controls conductive states of the first and second drivers according to an input signal, and switches the output impedances of the first and second drivers and the resistance value of the variable resistor between the emphasis mode and the de-emphasis mode,
wherein the first and second resistance values are set to values so that a ratio between a first differential resistance value that is a combined resistance of the first resistance value and the load resistor, and a second differential resistance value that is a combined resistance of the second resistance value and the load resistor, corresponds to a ratio between an amplitude of the differential signal in the emphasis mode and an amplitude of the differential signal in the de-emphasis mode, and
wherein a difference between a first output resistance value indicative of a combined resistance of the third resistance value and the fifth resistance value, and a second output resistance value indicative of a combined resistance of the fourth resistance value and the sixth resistance value is set to a value corresponding to a difference between the first differential resistance value and the second differential resistance value.

2. The semiconductor device according to claim 1, further comprising:
a third driver that is disposed between the first supply terminal and the second output terminal, has the same circuit configuration as that of the first driver, and is controlled in a conductive state complementarily with the first driver; and
a fourth driver that is disposed between the second supply terminal and the first output terminal, has the same circuit configuration as that of the second driver, and is controlled in the conductive state complementarily with the second driver.

3. The semiconductor device according to claim 2,
wherein the variable resistor includes a first switch circuit that is coupled in series between the first and second output terminals, a first bridge resistor, a second switch circuit that is coupled in series between the first and second output terminals, and a second bridge resistor,
wherein the first bridge resistor has the first resistance value, and the second bridge resistor has such a resistance value that a combined resistance of the first bridge resistor and the second bride resistor becomes the second resistance value,
wherein the first switch circuit is controlled in the conductive state in the emphasis mode and the de-emphasis mode, and
wherein the second switch circuit is controlled in the conductive state in the emphasis mode, and controlled in a non-conductive state in the de-emphasis mode.

4. The semiconductor device according to claim 2 or 3,
wherein the first driver includes:
a first output setting unit having a first switch transistor coupled in series between the first supply terminal and the first output terminal, and a first resistor; and
a second output setting unit having a second switch transistor coupled in series between the first supply terminal and the first output terminal, and a second resistor,
wherein the first resistor has such a resistance value that a combined resistance of the first resistor and the second resistor becomes the third resistance value,
wherein the second resistor has the fourth resistance value,
wherein the first switch transistor is controlled in the conductive state in the emphasis mode and the de-emphasis mode,
wherein the second switch transistor is controlled in the conductive state in the emphasis mode, and controlled in the non-conductive state in the de-emphasis mode,
wherein the second driver includes:
a third output setting unit having a third switch transistor coupled in series between the second supply terminal and the first output terminal, and a third resistor; and
a fourth output setting unit having a fourth switch transistor coupled in series between the second supply terminal and the first output terminal, and a fourth resistor,
wherein the third resistor has such a resistance value that a combined resistance of the third resistor and the fourth resistor has the fifth resistance value,
wherein the fourth resistor has the sixth resistance value,
wherein the third switch transistor is controlled in the conductive state in the emphasis mode and the de-emphasis mode, and
wherein the fourth switch transistor is controlled in the conductive state in the emphasis mode, and controlled in the non-conductive state in the de-emphasis mode.

5. The semiconductor device according to claim 4,
wherein the first and second resistors are shared by the first driver and the fourth driver, and
wherein the third and fourth resistors are shared by the second driver and the third driver.

6. The semiconductor device according to claim 2,
wherein the variable resistor includes:
a variable resistance transistor that is coupled between the first and second output terminals; and
a resistance controller that applies a first resistance setting voltage to a gate of the variable resistance transistor in the emphasis mode, with a resistance value between the source and the drain of the variable resistance transistor as the first resistance value, and applies a second resistance setting voltage to the gate of the variable resistance transistor in the de-emphasis mode, with the resistance value between the source and the drain of the variable resistance transistor as the second resistance value.

7. The semiconductor device according to claim 6, further comprising: a control voltage generator that generates the first resistance setting voltage and the second resistance setting voltage,
wherein the control voltage generator includes:
a first resistance setting transistor to which a first source current and a second source-drain voltage are applied in which a resistance value calculated according to a source-drain current and a source-drain voltage of the resistance setting transistor becomes equal to the first resistance value; and a second resistance setting transistor to which a second source current and the second source-drain voltage are applied in which a resistance value calculated according to the source-drain current and the source-drain voltage of the resistance setting transistor becomes equal to the second resistance value, and wherein the control voltage generator outputs a gate voltage of the first resistance setting transistor as the first resistance setting voltage, and outputs a gate voltage of the second resistance setting transistor as the second resistance setting voltage.

8. The semiconductor device according to claim 2 or 6, wherein the first driver includes:

a first drive transistor that is coupled between the first supply terminal and the first output terminal; and a first drive state controller that applies a third resistance setting voltage to a gate of the first drive transistor in the emphasis mode with a resistance value between the source and drain of the first drive transistor as the third resistance value, and applies a fourth resistance setting voltage to the gate of the first drive transistor in the de-emphasis mode with the resistance value between the source and drain of the first drive transistor as a fourth resistance value, and wherein the second driver includes:

a second drive transistor that is coupled between the second supply terminal and the second output terminal; and a second drive state controller that applies a fifth resistance setting voltage to a gate of the second drive transistor in the emphasis mode with a resistance value between the source and drain of the second drive transistor as the fifth resistance value, and applies a sixth resistance setting voltage to the gate of the second drive transistor in the de-emphasis mode with the resistance value between the source and drain of the second drive transistor as the sixth resistance value.

9. The semiconductor device according to claim 8, further comprising: a control voltage generator that generates the third resistance setting voltage and the fourth resistance setting voltage, wherein the control voltage generator includes:

a third resistance setting transistor to which a third source current and a third source-drain voltage are applied in which a resistance value calculated according to a source-drain current and a source-drain voltage of the resistance setting transistor becomes equal to the third resistance value; and a fourth resistance setting transistor to which a fourth source current and a fourth source-drain voltage are applied in which a resistance value calculated according to the source-drain current and the source-drain voltage of the resistance setting transistor becomes equal to the fourth resistance value, and wherein the control voltage generator outputs a gate voltage of the third resistance setting transistor as the third resistance setting voltage, and outputs a gate voltage of the fourth resistance setting transistor as the fourth resistance setting voltage.

10. The semiconductor device according to claim 8, wherein the first drive transistor and the second drive transistor are each configured by a transistor of the same conduction type.

11. The semiconductor device according to claim 8, wherein the first drive transistor is configured by a transistor of a first conduction type, and wherein the second drive transistor is configured by a transistor of a second conduction type.

12. A semiconductor device comprising:

first and second output terminals that are coupled with a load resistor;

a variable resistor that is disposed between the first output terminal and the second output terminal;

a first driver that is disposed between a first supply terminal and the first output terminal;

a second driver that is disposed between a second supply terminal and the second output terminal, and controlled in a conductive state together with the first driver;

a third driver that is disposed between the first supply terminal and the second output terminal, and controlled in the conductive state complementary with the first driver;

a fourth driver that is disposed between the second supply terminal and the first output terminal, and controlled in the conductive state together with the third driver; and a controller that controls the variable resistor and the first to fourth drivers in any one mode of an emphasis mode that increases an amplitude of a differential signal output from the first and second output terminal, and a de-emphasis mode that decreases the amplitude of the differential signal, wherein the first to fourth drivers allow a substantially constant current to flow in any mode while increasing the output impedance according to switching from the emphasis mode to the de-emphasis mode, and wherein the variable resistor varies a resistance value thereof so that a current flowing in the load resistor decreases according to the switching from the emphasis mode to the de-emphasis mode.

* * * * *